(12) United States Patent
Tanaka

(10) Patent No.: US 7,557,529 B2
(45) Date of Patent: Jul. 7, 2009

(54) STAGE UNIT AND EXPOSURE APPARATUS

(75) Inventor: Keiichi Tanaka, Saitama (JP)

(73) Assignee: Nikon Corporation, Tokyo (JP)

( * ) Notice: Subject to any disclaimer, the term of this patent is extended or adjusted under 35 U.S.C. 154(b) by 94 days.

(21) Appl. No.: 11/593,484

(22) Filed: Nov. 7, 2006

(65) Prior Publication Data

US 2007/0103660 A1    May 10, 2007

Related U.S. Application Data

(63) Continuation of application No. PCT/JP2006/300143, filed on Jan. 10, 2006.

(60) Provisional application No. 60/734,762, filed on Nov. 9, 2005.

(30) Foreign Application Priority Data

Jan. 11, 2005  (JP)  ............................... 2005-003779

(51) Int. Cl.
*G03B 27/42* (2006.01)
*H01L 21/027* (2006.01)

(52) U.S. Cl. ........................................ 318/649; 378/34

(58) Field of Classification Search ................. 318/648, 318/649; 378/34; 355/53, 72–77
See application file for complete search history.

(56) References Cited

U.S. PATENT DOCUMENTS

| | | | |
|---|---|---|---|
| 4,780,617 | A | 10/1988 | Umatate et al. |
| 5,448,332 | A | 9/1995 | Sakakibara et al. |
| 6,246,204 | B1 * | 6/2001 | Ebihara et al. ............... 318/649 |
| 6,408,045 | B1 * | 6/2002 | Matsui et al. .................. 378/34 |
| 6,778,257 | B2 | 8/2004 | Bleeker et al. |
| 6,781,138 | B2 * | 8/2004 | Novak et al. ........... 250/442.11 |
| 6,917,412 | B2 * | 7/2005 | Poon et al. ..................... 355/72 |
| 6,937,317 | B2 * | 8/2005 | Morisada ...................... 355/53 |
| 2002/0003616 | A1 | 1/2002 | Ebinuma et al. |
| 2002/0075467 | A1 | 6/2002 | Tanaka et al. |
| 2002/0075469 | A1 | 6/2002 | Tanaka |
| 2004/0012768 | A1 | 1/2004 | Tanaka et al. |
| 2004/0051854 | A1 | 3/2004 | Tanaka et al. |

FOREIGN PATENT DOCUMENTS

JP    A-61-044429    3/1986

(Continued)

*Primary Examiner*—Bentsu Ro
(74) *Attorney, Agent, or Firm*—Oliff & Berridge, PLC

(57) ABSTRACT

When a stage on which a wafer is mounted is driven in an X-axis direction by a liner motor, a reaction force of the drive force is generated at a stator and acts on a counterweight via the stator, and thereby the counterweight moves in a direction opposite to the stage in accordance with movement of the stage in the X-axis direction. Accordingly, the reaction force generated by the drive of the stage can substantially be canceled by the movement of the counterweight. Further, since the counterweight has a first section that is connected to the stator, and a second section that is separated from the first section in the X-axis direction and connected to the first section via a connection section, a partition wall of a chamber can be placed using the connected portion as a boundary, and the second section of the counterweight can be located outside the partition wall. Thus, a stage housing space can be set to smaller.

17 Claims, 9 Drawing Sheets

FOREIGN PATENT DOCUMENTS

| | | |
|---|---|---|
| JP | A-06-283403 | 10/1994 |
| JP | A-08-063231 | 3/1996 |
| JP | A-11-189332 | 7/1999 |
| JP | A-2002-198310 | 7/2002 |
| JP | A-2002-208562 | 7/2002 |
| JP | A-2004-134682 | 4/2004 |
| JP | A-2004-140145 | 5/2004 |
| JP | A-2004-193425 | 7/2004 |
| WO | WO 99/49504 A1 | 9/1999 |
| WO | WO 01/35168 A1 | 5/2001 |

* cited by examiner

STAGE UNIT AND EXPOSURE APPARATUS

CROSS-REFERENCE TO RELATED APPLICATIONS

This application is a continuation of International Application PCT/JP2006/300143, with an international filing date of Jan. 10, 2006, the disclosure of which is hereby incorporated herein by reference in its entirety, which was not published in English. This non-provisional application also claims the benefit of Provisional Application No. 60/734,762 filed Nov. 9, 2005, the disclosure of which is hereby incorporated herein by reference in its entirety.

BACKGROUND OF THE INVENTION

1. Field of the Invention

The present invention relates to stage units and exposure apparatuses, and more particularly to a stage unit that is suitable as a stage that sets the position of a specimen of an exposure apparatus or other precision instruments, and to an exposure apparatus that is equipped with the stage unit.

2. Description of the Background Art

Conventionally, in a lithography process for manufacturing a semiconductor device, a liquid crystal display device or the like, exposure apparatuses such as a reduction projection exposure apparatus by a step-and-repeat method (the so-called 'stepper') that transfers a pattern formed on a mask or a reticle (hereinafter generally referred to as a 'reticle') onto a substrate such as a wafer or a glass plate (hereinafter also referred to as a wafer as needed) that is coated with a resist or the like, or a scanning exposure apparatus by a step-and-scan method (a scanner) are mainly used.

In these types of exposure apparatuses, due to higher integration of semiconductor devices and finer pattern accompanying therewith, further improvement in resolution of a projection optical system has been required. Therefore, a wavelength of an exposure light has been shortened year by year and an exposure apparatus using an ArF excimer laser beam has also been in practical use. The resolution and a device rule required for an exposure apparatus become further stricter in the future without fail, which recently leads to the situation where an EUV exposure apparatus (EUVL) that uses an SOR (Synchrotron Orbital Radiation) ring, a laser plasma light source, or the like that emits an extreme ultraviolet (EUV) light having a wavelength equal to or less than 100 nm as an exposure light source draws the attention. Meanwhile, conventionally, when a fine pattern, for example, an original circuit pattern is drawn on a reticle blank, an electron beam exposure apparatus has been relatively frequently used.

In the stepper, the scanner or the like, a wafer stage is driven in XY two-dimensional directions by, for example, a drive unit including a linear motor or the like, in order to transfer a reticle pattern on a plurality of shot areas on a wafer. In particular, in the scanner, in order for a reticle stage and a wafer stage to perform acceleration, constant speed and deceleration respectively upon exposure, the vibration caused by a reaction force generated at a linear motor stator due to the acceleration/deceleration adversely affects the apparatus, in particular, an optical system, which causes the decrease in exposure accuracy. Therefore, any reaction force processing mechanism is indispensable. However, since the reticle stage only has to be movable back and forth only in a scanning direction, the reaction force and the vibration in the drive direction are easily processed on one axis, and a counter mass reaction processing mechanism using the law of conservation of momentum that is used most in general for mass production exposure apparatuses can be easily applied to (e.g. refer to Kokai (Japanese Unexamined Patent Application Publication) No. 08-063231 and the U.S. Pat. No. 6,246,204). On the contrary, since the wafer stage moves in the X-axis and Y-axis directions in a long stroke as described above, the reaction processing cannot be performed easily, and in order to realize the reaction processing, in some cases, a stage structure needs to be devised.

In the recent ultraviolet exposure apparatus (irrespective of whether an immersion type or not), since a degree of cleanliness of a main section in which exposure is performed needs to be maintained at a very high level, for example, at nearly Class 1, for example, in the case of ArF excimer laser exposure apparatus or the like, a main section of the exposure apparatus is covered by a chamber that is called as an environmental chamber and the inside of the chamber is isolated from the outside so that a clean state is maintained. Further, since an EUV light is absorbed by almost all substances, an optical path space of an EUV light needs to be set to a predetermined high vacuum state, and in a normal EUV exposure apparatus, an optical path of an exposure light as a matter of course, and a movement space of a wafer stage that moves while holding a wafer need to be set to a vacuum state. Therefore, the wafer stage is placed in a vacuum chamber. Besides, in an electron beam exposure apparatus, a wafer stage needs to be placed in a vacuum chamber in order to deflect a beam to a desired direction.

Thus, in a present-day exposure apparatus, regardless of the types, a wafer stage is placed in a chamber, and therefore, in the case a conventional counter mass mechanism is employed, a counter mass (hereinafter referred to as a 'counterweight') that moves a distance in a direction opposite to a drive direction of the stage in accordance with a drive distance of the stage needs to be placed within the chamber. In this case, in order to shorten a movement stroke of the counterweight, a heavy weight and large size counterweight needs to be housed within the chamber and the inner volume of the chamber has to be increased. On the other hand, when decreasing the size and weight of the counterweight, a movement distance of the counterweight becomes longer when receiving a reaction force at the time of driving the wafer stage, and as a consequence, the inner volume of the chamber in which the counterweight is housed has to be increased. In either case, the chamber tends to be larger in size.

For example, in an ArF excimer laser exposure apparatus or the like, the increase in size of the chamber leads to the increase in size of an air supply fan, a cooler, a heater, an air filter and the like that constitute an air-conditioner, and to the increase in power consumption, and for example, in an EUV exposure apparatus and an electron beam exposure apparatus, leads to the increase in size of a vacuum pump and other vacuum-related instruments and the increase in power consumption.

Also in an apparatus other than an exposure apparatus, the similar inconvenience occurs as far as the apparatus houses a stage inside a chamber or a space partitioned by a partition wall.

SUMMARY OF THE INVENTION

The present invention has been made in consideration of the situation described above, and according to a first aspect of the present invention, there is provided a first stage unit, comprising: a first stage that has a mount section on which an object is mounted; a first drive mechanism that has a first mover that is connected to the first stage and a first stator that works with the first mover, and drives the first stage in a first axis direction; and a first counterweight that has a first section that is connected to the first stator, a second section that is arranged along the first axis direction separately from the first section and a connection section that connects the first section and the second section, and moves in a direction opposite to the first stage in accordance with movement of the first stage in the first axis direction.

With this stage unit, since the first counterweight is divided into the first section and the second section that is connected to the first section via the connection section, a degree of freedom in design and a degree of freedom in arrangement of the first counterweight improve.

According to a second aspect of the present invention, there is provided a second stage unit, comprising: a stage that has a mount section on which an object is mounted; a drive mechanism that has a coil and a magnet, and drives the stage in one axis direction; and a counterweight where at least one of an electric current supply section that supplies electric current to the coil and a fluid supply section that supplies a fluid to the coil is formed, and that moves in a direction opposite to the stage in accordance with movement of the stage in the one axis direction.

With this stage unit, at least one of electric current and a fluid can be supplied to the coil via the supply section of the counterweight.

According to a third aspect of the present invention, there is provided an exposure apparatus that exposes a substrate with an energy beam in order to form a pattern on the substrate, the apparatus comprising: any one of the first and second stage units of the present invention, on the mount section of which the substrate is mounted as the object.

With this apparatus, a substrate is mounted on the mount section of each stage unit, the substrate is exposed by an energy beam and a pattern is formed, and therefore, exposure can be performed in a state where the effect of vibration caused by a reaction force at the time of driving the stage is reduced, which makes it possible to improve exposure accuracy.

According to a fourth aspect of the present invention, there is provided a third stage unit, comprising: a stage that has a mount section on which an object is mounted; a drive mechanism that has a mover that is connected to the stage and a stator that works with the mover, and drives the stage in one axis direction; and a counterweight that has a first section that is connected to the stator and a second section that is placed in a second space that is different from a first space in which the first section is placed, and moves in a direction opposite to the stage in accordance with movement of the stage in the one axis direction.

With this stage unit, since the counterweight is divided into the first section placed in the first space and the second section placed in the second space that is different from the first space, a degree of freedom in design and a degree of freedom in arrangement of the counterweight improve, and in addition, the inner volume of the first space can be set smaller compared to the case when the entire counterweight is placed in one space.

According to a fifth aspect of the present invention, there is provided a fourth stage unit, comprising: a stage that has a mount section on which an object is mounted; a drive mechanism that has a mover that is connected to the stage and a stator that works with the mover, and drives the stage in one axis direction; and a counterweight that has a first section that is connected to the stator and moves in a direction opposite to the stage in accordance with movement of the stage in the one axis direction, a second section that is supported movable synchronously with the first section and a connection section that connects the first section and the second section.

DESCRIPTION OF THE EMBODIMENTS

An embodiment of the present invention will be described as follows based on FIGS. 1 to 8.

Figure 1:
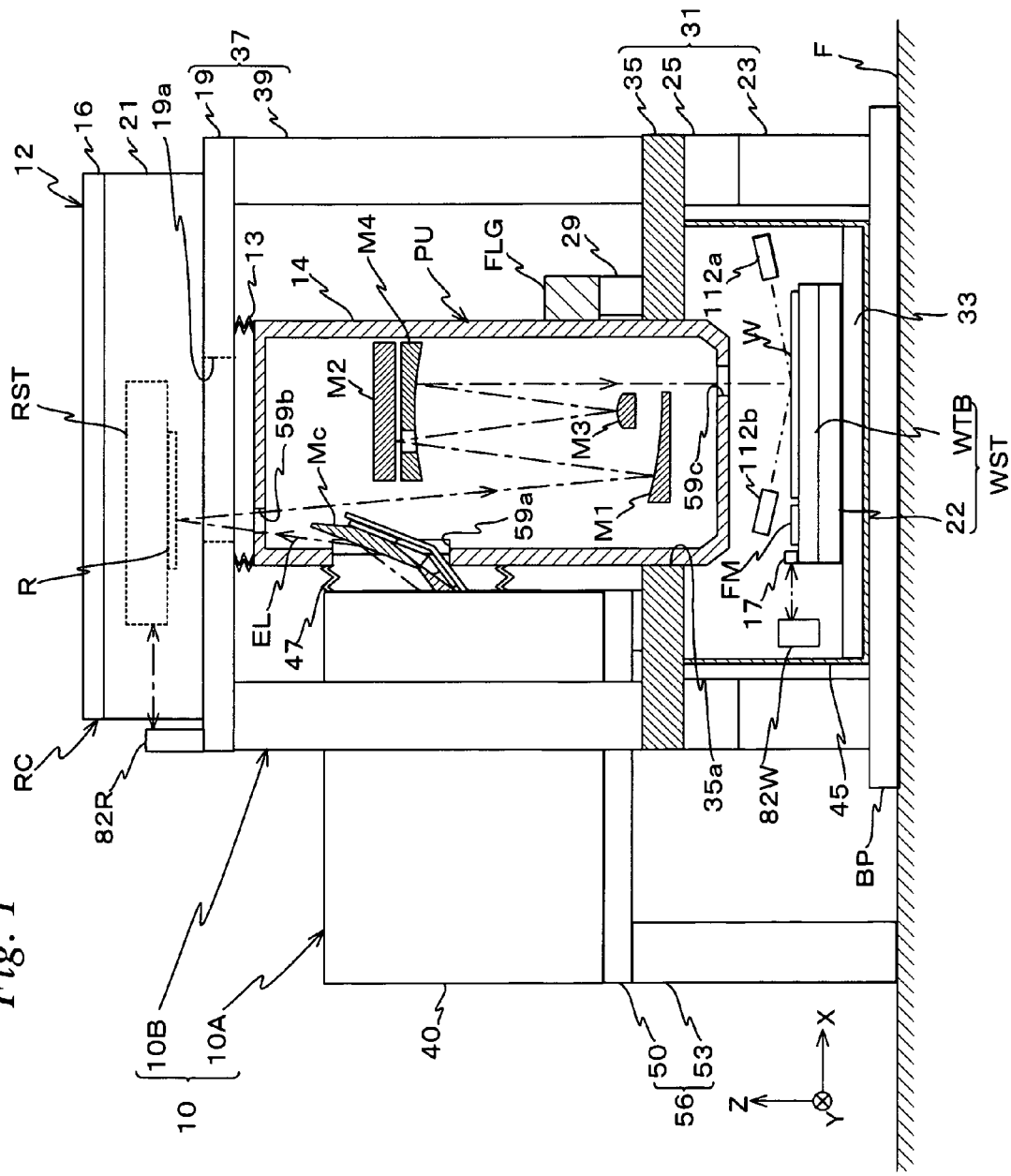
FIG. 1 is a view schematically showing an entire configuration of an exposure apparatus related to an embodiment.

FIG. 1 schematically shows the entire configuration of an exposure apparatus 10 related to an embodiment. In FIG. 1, a sectional view of a part of exposure apparatus 10, more specifically, a sectional view of a projection unit PU and a wafer stage chamber 45 is shown in order to show an internal configuration.

In exposure apparatus 10, since projection unit PU, which has a projection optical system inside that projects a reflected beam from reticle R perpendicularly on a wafer W, is employed, in the following description, a projection direction of an illumination light from the projection optical system to wafer W is called as an optical axis direction of the projecting optical system, and also the description will be made assuming that the optical axis direction is a Z-axis direction, a horizontal direction in the page surface of FIG. 1 that is orthogonal to the optical axis direction within a plane is an X-axis direction, and a direction orthogonal to the page surface is a Y-axis direction.

By relatively scanning reticle R and wafer W in a one-dimensional direction (the X-axis direction) with respect to projection unit PU while projecting an image of a part of a circuit pattern formed on a reticle R (hereinafter shortly referred to as a 'reticle pattern') on wafer W via the projection optical system within projection unit PU, exposure apparatus 10 transfers the reticle pattern on each of a plurality of shot areas on wafer W in a step-and-scan method.

Exposure apparatus 10 is equipped with an illumination unit 10A that illuminates reticle R with an illumination light (EUV light) EL, and an exposure apparatus main section 10B a part of which is connected to illumination unit 10A.

In FIG. 1, Illumination unit 10A is shown simply as a block for the sake of convenience, however, in actual, illumination unit 10A is equipped with an illumination system that is constituted by an exposure light source (not shown) that is made up of an SOR (Synchrotron Orbital Radiation) ring emitting an illumination light (EUV light) EL in a soft X ray range, for example, an illumination light (EUV light) EL having a wavelength of 11 nm and an illumination optical system (not shown), a beam line (not shown) that connects them, and the like; and an illumination system chamber 40 that houses the illumination system.

Illumination system chamber 40 is placed on an illumination system holding frame 56 that is configured of a plurality of support members 53 arranged on a floor surface F and a support platform 50 that is horizontally supported by support members 53. Illumination chamber 40 is structured highly air-tight so that a high vacuum state of a space divided by illumination system chamber 40 and support platform 50, and the like can be maintained.

The illumination optical system is configured including, for example, a mirror system, a fly eye mirror, a mirror unit (e.g. a reflection mirror made up of a plurality of toroidal aspheric oblique incidence mirrors) and the like. Of components of the illumination optical system, the mirror unit constitutes an emitting end of the illumination system, and a part of the mirror unit is in a state of protruding from an opening of illumination system chamber 40 that covers a predetermined space above support members 53. The illumination optical system makes illumination light EL emitted from the light source be sequentially reflected and be finally incident on a pattern surface (a lower surface (a surface on a −Z side in FIG. 1) of reticle R at a predetermined incident angle, for example, around 50 [mrad].

As is shown in FIG. 1, exposure apparatus main section 10B is equipped with a reticle stage unit 12 that includes a reticle stage RST that holds reticle R, a reticle stage chamber that houses reticle stage RST, a drive system thereof and the like, and the like; projection unit PU that includes a projection optical system that projects illumination light EL reflected off a pattern surface of reticle R to a surface to be exposed of wafer W, a wafer stage WST on which wafer W is mounted, a first column 31 that holds projection unit PU, a second column 37 that supports reticle stage unit 12 on a barrel platform (main frame) 35 that constitutes first column 31, a wafer stage chamber 45 that houses wafer stage WST and the like, and the like.

Reticle stage unit 12 is equipped with a reticle stage chamber RC, reticle stage RST that is housed inside reticle stage chamber RC, a reticle stage drive system 11 (not shown in FIG. 1, refer to FIG. 8) that drives reticle stage RTS in the X-axis direction serving as a scanning direction and finely drives reticle stage RST within an XY plane (including θz rotation), and the like.

Reticle stage chamber RC is configured of a lower side plate 19 that constitutes a top board of second column 37, a sidewall member 21 having a rectangular frame shape in a planar view (when viewed from above) that is fixed to the upper surface of lower side plate 19, an upper side plate 16 that is fixed to the upper surface of sidewall member 21. In the embodiment, lower side plate 19 serves as both a component of reticle stage chamber RC and a component of second column 37.

In a center portion of lower side plate 19, an opening 19a is formed, and a circumference portion of opening 19a of the lower surface of lower side plate 19 and the upper end surface of projection unit PU are connected by a bellows 13, which prevents outside air from entering an inner space of reticle stage chamber RC and an inner space of projection unit PU (more precisely, barrel 14).

As reticle R, a reflective type reticle is used so as to correspond to illumination light EL that is an EUV light having a wavelength of 11 nm. Reticle R is held on reticle stage RST in a state where the pattern surface is a lower surface. Reticle R is made up of a thin plate such as silicon wafer, quartz or a low-expansion glass, and a reflective film that reflects the EUV light is formed on a surface (the pattern surface) in a −Z side. The reflective film is a multilayer film that is formed by a film of molybdenum (Mo) and a film of beryllium (Be) that are alternately overlaid in around 5.5 nm period in about 50 pairs. The multilayer film has a reflectivity of around 70% with respect to the EUV light having a wavelength of 11 nm.

On the multilayer film formed on the pattern surface of reticle R, as an absorber layer, for example, nickel (Ni) or aluminum (Al) is coated on the entire surface, and patterning is performed to the absorber layer and a circuit pattern is formed.

Illumination light (EUV light) EL that is incident on a portion of reticle R where the absorber layer remains is absorbed by the absorber layer, and illumination light EL that is incident on a portion where the absorber layer comes away (a portion where the absorber layer is removed) is reflected by the reflective film, and as a consequence, illumination light EL containing information on the circuit pattern propagates toward projection unit PU as the reflected light from the pattern surface of reticle R.

The position of reticle stage RST within the XY plane is detected by a reticle laser interferometer (hereinafter referred to as a 'reticle interferometer') 82R that is placed outside reticle stage chamber RC and is fixed to lower side plate 19, via a window section (not shown) arranged at sidewall member 21. The window section is arranged in actual on a −X side surface and a +Y side surface of sidewall member 21 respectively, and as the reticle interferometer, a reticle X interferometer and a reticle Y interferometer are arranged corresponding to these window sections. However, in FIG. 1, these interferometers are representatively shown by reticle interferometer 82R. Measurement values of reticle interferometer 82R are supplied to a main controller 20(not shown in FIG. 1, refer to FIG. 8), and reticle stage drive system 11 is controlled by main controller 20 and accordingly the position of reticle stage RST (reticle R) is controlled.

In exposure apparatus 10 of the embodiment, as a mechanism used to cancel a reaction force accompanying the drive of reticle stage RST, a reaction force chancel mechanism that uses the law of conservation of momentum as is disclosed in, for example, Kokai (Japanese Unexamined Patent Application Publication) No. 08-063231 and the corresponding U.S. Pat. No. 6,246,204 and the like is employed, though the mechanism is not shown in the drawings. As long as the national laws in designated states (or elected states), on which this international application is applied, permit, the above disclosures of the publication and the U.S. Patent are incorporated herein by reference.

Second column 37 includes a plurality of (e.g. three or four) column supports 39 that are arranged on the upper surface of first column 31 and lower side plate 19 that is supported by the plurality of column supports 39 and constitutes a top board of second column 37.

First column 31 includes a plurality of (e.g. three or four) support member 23 that are arranged on the upper surface of a base plate BP horizontally placed on floor surface F, a plurality of vibration isolation units 25 each one of which is arranged on an upper portion of each support member 23, barrel platform 35 that is supported substantially horizontal by support members 23 and vibration isolation units 25 on floor surface F.

Each of isolation vibration units 25 includes an air mount whose inner pressure is adjustable and a voice coil motor that are placed in series (or in parallel) on an upper portion of support member 23. By the air mount of each vibration isolation unit 25, a fine vibration from floor surface F that transmits to barrel platform 35 via floor surface F, base plate BP and support member 23 is isolated.

Barrel platform 35 is made of cast metal and the like, and has a first opening 35a that is formed in a center portion of barrel platform 35 and has a circular shape in a planar view (when viewed from above), and a second opening (not shown) that is formed spaced apart a predetermined distance from first opening 35a in the −X direction.

Inside first opening 35a of barrel platform 35, projection unit PU described earlier is inserted from above, and a flange section FLG of projection unit PU is supported at three points from below by three vibration isolation units (only one vibration isolation unit is shown in FIG. 1) 29 arranged on barrel platform 35. As each vibration isolation unit 29, a vibration isolation unit having a configuration similar to vibration isolation unit 25 is used.

Inside the second opening of barrel platform 35, an alignment detection system ALG (not shown in FIG. 1, refer to FIG. 8) is inserted from above, and is fixed to barrel platform 35 via a flange that is arranged on the circumference portion. As alignment detection system ALG, various sensors/microscopes can be used such as an alignment sensor by an FIA (Field Image Alignment) method that irradiates a broadband beam to an alignment mark on wafer W (or an aerial image measurement instrument FM, which will be described later) and performs mark detection by photodetecting the reflected beam and performing image processing; an alignment sensor by an LIA (Laser Interferometric Alignment) method that irradiates a laser beam from two directions to an alignment mark having an diffraction grating structure on wafer W and makes two diffracted beams interfere and then detects position information of the alignment mark from the phase; an alignment sensor by an LSA (Laser Step Alignment) method that irradiates a laser beam to an alignment mark on wafer W and measures a mark position by using intensity of the diffracted/scattered beam, and scanning probe microscope such as an AFM (Atomic Force Microscope).

Projection unit PU is equipped with a barrel 14 and a projection optical system that is made up of four mirrors (reflective optical element) in total, which are a second mirror M2, a fourth mirror M4, a third mirror M3 and a first mirror M1 that are sequentially placed from the top to the bottom in a predetermined positional relation inside barrel 14 as is shown in FIG. 1. In the projection optical system, the numerical aperture (N.A.) is set to, for example, 0.1, and the projection magnification is set to ¼. Further, an opening is formed in fourth mirror M4 as is shown in FIG. 1.

Further, as can be seen from FIG. 1, an opening 59a is formed in a sidewall of barrel 14 on a −X side, and one reflective mirror Mc that constitutes the mirror unit described earlier is inserted into barrel 14 through opening 59a. Moreover, in an upper wall (a ceiling wall) and a bottom wall of barrel 14, openings 59b and 59c that serve as paths of illumination light EL are formed respectively.

Further, between barrel 14 and illumination system chamber 40, a freely extendable/contractible bellows 47 that connects barrel 14 and illumination system chamber 40 is arranged in the periphery portion of opening 59a and of an opening on a side of illumination system chamber 40 that faces opening 59a. Bellows 47 insulates an inner space of barrel 14 and an inner space of illumination system chamber 40 in a substantially airtight state from the outside, and suppresses transmission of the vibration between barrel 14 and illumination system chamber 40.

With projection unit PU configured as described above, as is shown in FIG. 1, illumination light EL described earlier reaches a reflection surface of reflective mirror Mc and after being reflected off the reflection surface and condensed, illumination light EL is incident on a pattern surface (a lower surface) of reticle R at a predetermined incident angle, for example, 50 (mrad) via opening 59b of barrel 14. With this operation, the pattern surface of reticle R is illuminated by illumination light EL having a circular arc slit shape.

Then, illumination light EL that is reflected off the pattern surface of reticle R and includes information on a reticle pattern is incident inside barrel 14 via opening 59b and reaches first mirror M1. Illumination light EL reflected off a reflection surface of first mirror M1 is incident on a reflection surface of second mirror M2 via the opening of fourth mirror M4, and then is reflected off the reflection surface of second mirror M2 and incident on a reflection surface of mirror M3 via the opening of fourth mirror M4. Illumination light EL reflected off the reflection surface of third mirror M3 is reflected off a reflection surface of mirror M4 and the direction of a principal ray is deflected into a vertical downward direction. Then, illumination light EL is projected on wafer W. With this operation, a reduced image of the reticle pattern is formed on wafer W.

Moreover, a wafer focus sensor (112a, 112b) is integrally attached to barrel 14 of projection unit PU via a holding section (not shown). As the wafer focus sensor (112a, 112b), a multipoint focal position detection system by an oblique incident method is used that is equipped with an irradiation system 112a that irradiates a plurality of beams to a surface to be detected (a surface of wafer W) from a direction inclined at a predetermined angle with respect to an optical axis of the projection optical system and a photodetection system 112b that has a plurality of photodetection elements that severally receive a reflected beam of each of the plurality of beams from the surface to be detected. The wafer focus sensor (112a, 112b) measures a position in the Z-axis direction and an inclination amount of the surface of wafer W using barrel 14 of projection unit PU as a datum. The details of a multipoint focal position detection system having a configuration similar to the wafer focus sensor (112a, 112b) are disclosed in, for example, Kokai (Japanese Unexamined Patent Application Publication) No. 06-283403 and the corresponding U.S. Pat. No. 5,448,332 and the like. As long as the national laws in designated states (or elected states), on which this international application is applied, permit, the above disclosures of the publication and the U.S. Patent are incorporated herein by reference.

Wafer stage WST described earlier is equipped with an XY moving section 22 that is driven in a predetermined stroke (the stroke is, for example, 300 to 400 mm) in the X-axis direction and the Y-axis direction along the upper surface of wafer stage base 33 by a wafer drive system 27 (not shown in FIG. 1, refer to FIG. 8) including an actuator such as a liner motor and also driven in a θz direction (a rotation direction around the Z-axis) by a very small amount, and a wafer table WTB that is placed above XY moving section 22 and driven in an inclination direction by a very small amount with respect to the XY plane by wafer drive system 27.

Figure 2:
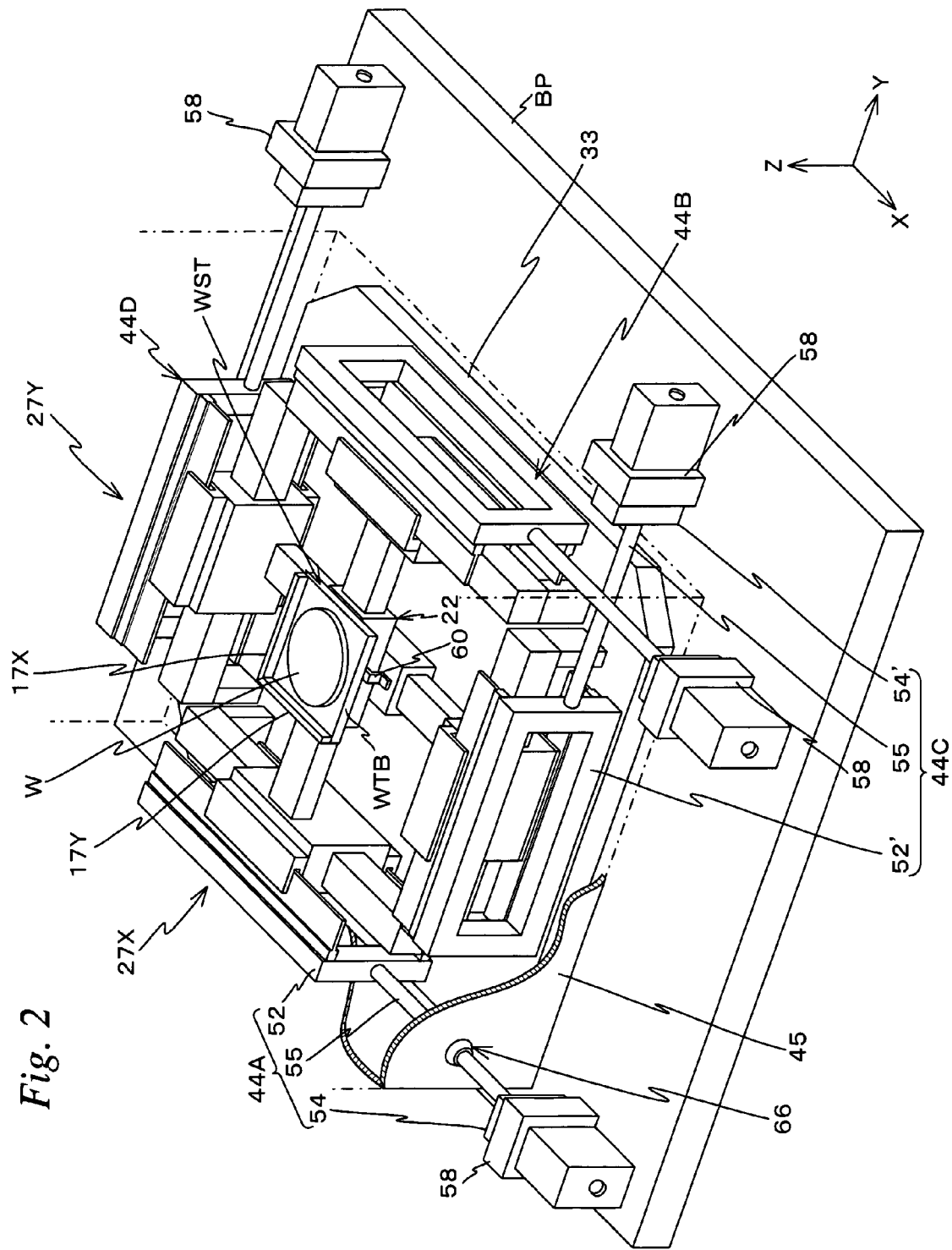
FIG. 2 is a perspective view showing a wafer stage constituting the exposure apparatus in FIG. 1 and a wafer drive system, together with a part of a wafer stage chamber 45.

On the upper surface of wafer table WTB, a wafer holder (not shown) by an electrostatic chuck method is mounted and wafer W is held on the wafer holder by suction. The position of wafer table WTB is constantly detected by a wafer laser interferometer (hereinafter referred to as a 'wafer interferometer') 82W, which is placed outside, via a movable mirror 17 at a resolution of, for example, around 0.5 to 1 nm. Incidentally, in actual, as is shown in FIG. 2, on the upper surface of wafer table WTB, an X movable mirror 17X that has a reflection surface orthogonal to the X-axis direction is arranged extending in the Y-axis direction and a Y movable mirror 17Y that has a reflection surface orthogonal to the Y-axis direction is arranged extending in the X-axis direction, and as the wafer interferometer, an X interferometer and a Y interferometer are also arranged respectively corresponding to the movable mirrors. However, in FIG. 1, they are representatively shown as movable mirror 17 and wafer interferometer 82W respectively. The X interferometer and the Y interferometer are configured of a multi-axis interferometer having a plurality of measurement axes, and can measure rotation (yawing (θz rotation being a rotation around the Z-axis), pitching (θy rotation being a rotation around the Y-axis), and rolling (θx rotation being a rotation around the X-axis), besides the X and Y positions of wafer table WTB.

Measurement values of wafer interferometer 82W and the wafer focus sensor (112a, 112b) are supplied to main controller 20 (refer to FIG. 8), and the position and the attitude of wafer table WTB in six-dimensional directions is controlled by main controller 20 controlling wafer drive system 27.

On one end portion of the upper surface of wafer table WTB, as is shown in FIG. 1, aerial image measurement instrument FM is arranged for performing measurement of a relative positional relation between a position where a pattern formed on reticle R is projected on a surface of wafer W and alignment detection system ALG described earlier (the so-called baseline measurement) and the like. Aerial image measurement instrument FM corresponds to a fiducial mark plate in a conventional DUV exposure apparatus.

Wafer stage chamber 45 described above has an substantially box-like shape whose upper surface is opened, and is fixed to the lower surface of barrel platform 35 and also placed on base plate BP. Wafer stage chamber 45 is configured so that a high vacuum state in a closed space (a wafer room) that is partitioned by wafer stage chamber 45 and barrel platform 35 can be maintained. As is obvious from the description so far, in the embodiment, an airtight space is formed that communicates the respective inside of reticle stage chamber RC, bellows 13, barrel 14 of projection unit PU, bellows 47, illumination system chamber 40 and wafer stage chamber 45 with each other. In this case, as an example, a high vacuum state of around $10^{-4}$ [Pa] is to be maintained within the airtight space.

Next, the configuration of wafer drive system 27 and the like will be described based on FIGS. 2 to 6 and 8.

FIG. 2 shows wafer stage WST and the respective components of wafer drive system 27 together with a part of wafer stage chamber 45 in a perspective view. As is shown in FIG. 2, wafer drive system 27 is equipped with an X-direction drive mechanism 27X and a Y-direction drive mechanism 27Y that drive wafer stage WST in the X-axis direction and the Y-axis direction respectively along wafer stage base 33 placed on the inner bottom surface of wafer stage chamber 45, and the like. Besides, wafer drive system 27 is also equipped with Z/tilt drive mechanism (not shown in FIG. 2, refer to FIG. 8) that drives wafer table WTB in directions of three degrees of freedom, i.e. the Z, θx and θy directions with respect to XY moving section 22 that constitutes a part of wafer stage WST.

Figure 3:
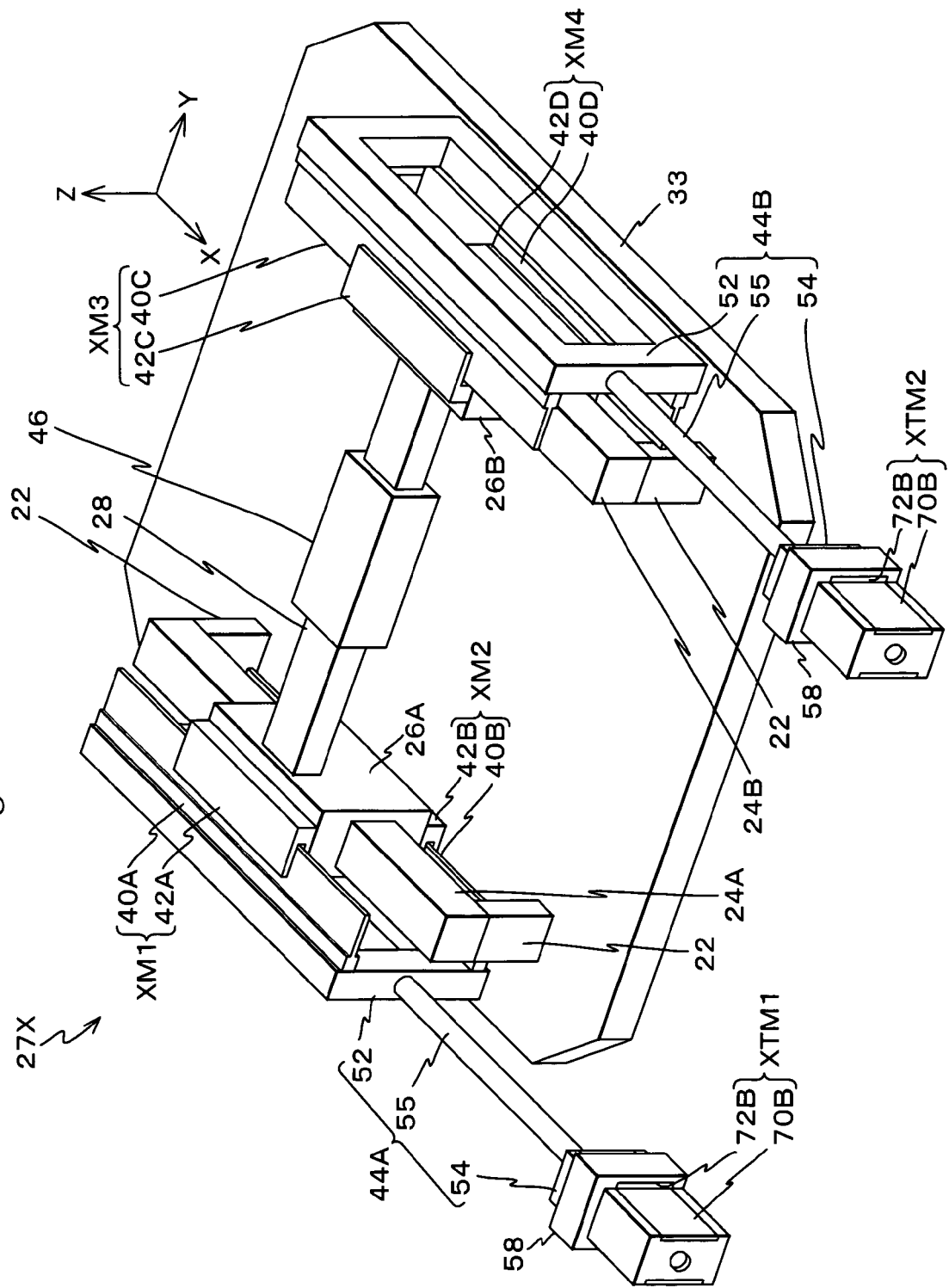
FIG. 3 is a perspective view particularly showing an X-direction drive mechanism 27X in FIG. 2.

As is shown in FIG. 2 and a perspective view in FIG. 3 that shows X-direction drive mechanism 27X in particular, X-direction drive mechanism 27X is equipped with: a pair of X-axis guides 24A and 24B that are arranged extending in the X-axis direction in the vicinity of an end portion on one side and the other side of the Y-axis direction on the upper surface of stage base 33 respectively, and one end and the other end of which in a longitudinal direction are supported by support member 22 respectively; a pair of X-axis sliders 26A and 26B that are attached to the circumference of X-axis guides 24A and 24B respectively; a pair of X-axis linear motors XM1 and XM2 and a pair of X-axis linear motors XM3 and XM4 that drive X-axis sliders 26A and 26B along X-axis guides 24A and 24B respectively; a Y guide 28 that has a pair of Y sliders 26A and 26B fixed to one end and the other end of its longitudinal direction and that extends in the Y-axis direction; a pair of X-axis counterweights 44A and 44B that move in a direction opposite to X-axis slider 26A and 26B by respectively receiving a reaction force generated at the time of driving X-axis sliders 26A and 26B by X-axis linear motors XM1, XM2, XM3 and XM4; and a pair of X-axis trim motors XTM1 and XTM2 that adjust the positions of X-axis counterweights 44A and 44B by driving X-axis counterweights 44A and 44B in the X-axis direction respectively.

To Y guide 28, a Y slider 46 whose XZ cross section has a rectangular frame shape is attached slidably.

X-axis sliders 26A and 26B are formed by a member whose YZ cross section has a rectangular frame shape respectively, and is respectively attached in a state of enclosing four surfaces, i.e. the left, right, top and bottom surfaces of each of X-axis guides 24A and 24B that are made up of a rod member having a rectangular cross section. In this case, X-axis sliders 26A and 26B are respectively supported in a noncontact manner via a predetermined clearance (e.g. a clearance of about several μm) with respect to X-axis guides 24A and 24B via a non-contact bearing, for example, a differential evacuation type air bearing that is severally arranged on four inner surfaces, i.e. the left, right, top and bottom inner surfaces of each of X-axis sliders 26A and 26B.

X-axis counterweight 44A is placed on a −Y side of X-axis guide 24A and X-axis counterweight 44B is placed on a +Y side of X-axis guide 24B. Each of X-axis counterweights 44A and 44B has the following three sections respectively: a first weight section 52 that is made up of an oblong frame shaped member extending in the Y-axis direction that is supported by levitation via a predetermined clearance (e.g. a clearance of about several μm) above the upper surface of stage base 33 via a noncontact bearing, for example, differential evacuation type air bearing arranged on the bottom surface of first weight section 52; a second weight section 54 that is placed a predetermined distance apart from first weight section 52 on a +X side; and a rod section 55 that interconnects first weight 52 and second weight 54 and has its longitudinal direction in the X-axis direction. In this case, movement of each first weight section 52 in the Y-axis direction is blocked by a stopper (not shown) and only movement in the X-axis direction is permitted.

In the embodiment, as is shown in FIG. 2, first weight section 52 constituting each of X-axis counterweights 44A and 44B is placed in a vacuum space inside wafer stage chamber 45, and second weight section 54 is placed in the air atmosphere outside wafer stage chamber 45. Accordingly, in the following description, first weight section 52 is to be called as vacuum counterweight section 52 and second weight section 54 is to be called as atmosphere counterweight section 54. Incidentally, a part of rod section 55 is placed in vacuum and a remaining part is placed in the atmosphere.

Each atmosphere counterweight section 54 that constitutes a apart of each of X-axis counterweights 44A and 44B has a substantially rectangular solid shape and is respectively supported by levitation via a predetermined clearance (e.g. a clearance of about several μm) above the upper surface of base plate BP via a noncontact bearing, for example, an air bearing, arranged on the bottom surface of each atmosphere counterweight section 54.

As is shown in FIG. 3, X-axis linear motor XM1 has a mover 42A having a U-like shape in a side view (when viewed from a +X side or −X side) that is fixed to the upper surface of one X-axis slider 26A, and a stator 40A having a T-like shape in a side view that engages with mover 42A via a predetermined clearance and is fixed to the surface on a +Y side of vacuum counterweight section 52 constituting a part of X-axis counterweight 44A. Further, X-axis linear motor XM2 has a mover 42B having a U-like shape in a side view that is fixed to the lower surface of X-axis slider 26A, and a stator 40B having a T-like shape in a side view that engages with mover 42B via a predetermined clearance and is fixed to the surface on a +Y side of vacuum counterweight section 52 constituting a part of X-axis counterweight 44A.

In this case, each of movers 42A and 42B is made up of a magnetic pole unit that has a plurality of field magnets arranged on the surfaces facing in the vertical direction and an alternating magnetic field in the X-axis direction is formed inside. Stators 40A and 40B are made up of an armature unit that has a plurality of armature coils placed along the X-axis direction inside. That is, X-axis linear motor XM1 or XM2 is a moving magnet type linear motor by an electromagnetic power drive method that generates Lorentz force (a thrust force) that drives X-axis slider 26A along X-axis guide 24A by electromagnetic interaction between movers 42A or 42B and corresponding stators 40A or 40B.

As is shown in FIG. 3, each of X-axis linear motors XM3 and XM4 is a moving magnet type linear motor by an electromagnetic power drive method similar to the one described above, which has mover 42C or 42D like mover 42A described above that is respectively fixed to the upper surface or the lower surface of the other X-axis slider 26B, and stator 40C or 40D like stator 40A described above that engages with mover 42C or 42D via a predetermined clearance and is respectively fixed to the surface on a −Y side of vacuum counterweight section 52 constituting a part of X-axis counterweight 44B.

In this case, when an X movable section constituted by X-axis sliders 26A and 26B, Y guide 28 and slider 46 is driven in the X-axis direction by each of pairs of XM1 and XM2, and XM3 ad XM4, a reaction force of the drive force is generated at each of stators 40A, 40B, 40C and 40D, and due to an action of the reaction force, X-axis counterweights 44A and 44B move in a direction opposite to the X movable section (such as X-axis sliders 26A and 26B) according to the law of conservation of momentum.

Accordingly, in the case any countermeasure is not taken, the positions of X-axis counterweights 44A and 44B are deviated too far from the initial positions due to the drive of the X movable section described above, and for example, the inconvenience may occur such as the case where vacuum counterweight section 52 or atmosphere counterweight section 54 touches wafer stage chamber 45, and the like. Further, a force toward −X direction by an accumulated value of all the atmospheric pressure, which acts on a protruding portion (atmosphere counterweight section 54 and a part of rod section 55) that protrudes to the outside on a +X side of wafer stage chamber 45 (the difference between a force toward −X direction due to the atmospheric pressure that acts on a +X side end surface of atmosphere counterweight section 54 and a force toward +X direction due to the atmospheric pressure that acts on a −X side end surface of atmosphere counterweight section 54), constantly acts on X-axis counterweights 44A and 44B. Therefore, in the case any countermeasure is not taken, X-axis counterweights 44A and 44B respectively move to the −X side, which may cause the touch as described. Thus, in order to prevent X-axis counterweights 44A and 44B from deviating from the initial positions farther than necessary, in the embodiment, a pair of X-axis trim motors XTM1 and XTM2 are arranged.

Figure 4:
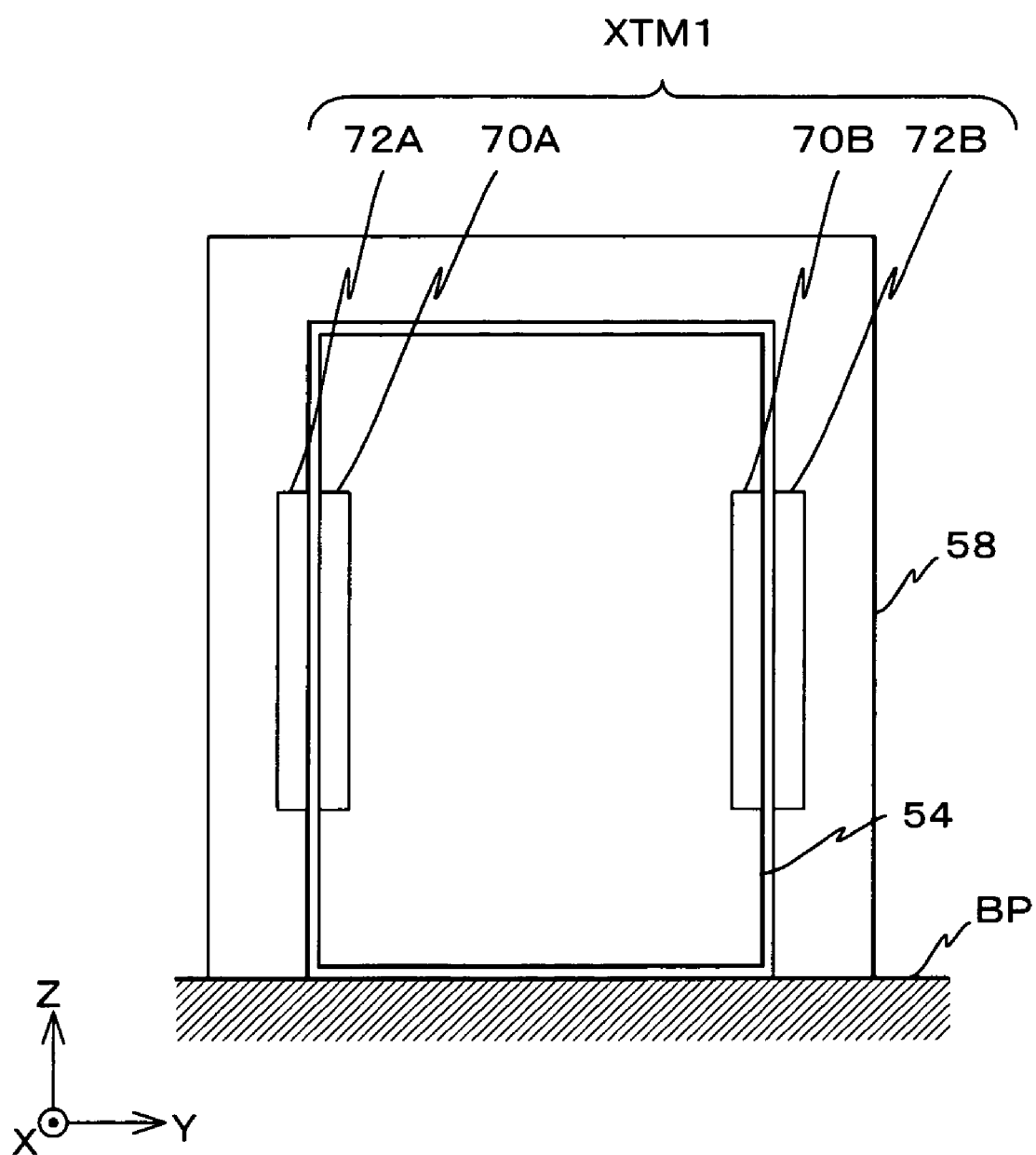
FIG. 4 is a view used to explain a configuration of an X-axis trim motor XTM1.

As is shown in FIGS. 3 and 4, one X-axis trim motor XTM1 is made up of magnetic pole units 70A and 70B that are respectively arranged on a side surface on one side and the other side of the Y-axis direction of atmosphere counterweight section 54 constituting a part of X-axis counterweight 44A, and armature units 72A and 72B that are placed in a state of enclosing the upper surface and both side surfaces in the Y-axis direction of atmosphere counterweight section 54, and respectively arranged on the inner opposing surfaces of double housing bent member 58 whose foot portion is fixed to base plate BP. That is, X-axis trim motor XTM1 is a motor such as a moving magnet type linear motor or voice coil motor that drives X-axis counterweight 44A in the X-axis direction.

The other X-axis trim motor XTM2 is configured similarly to the X-axis trim motor XTM1 described above (refer to FIG. 3).

Figure 5:
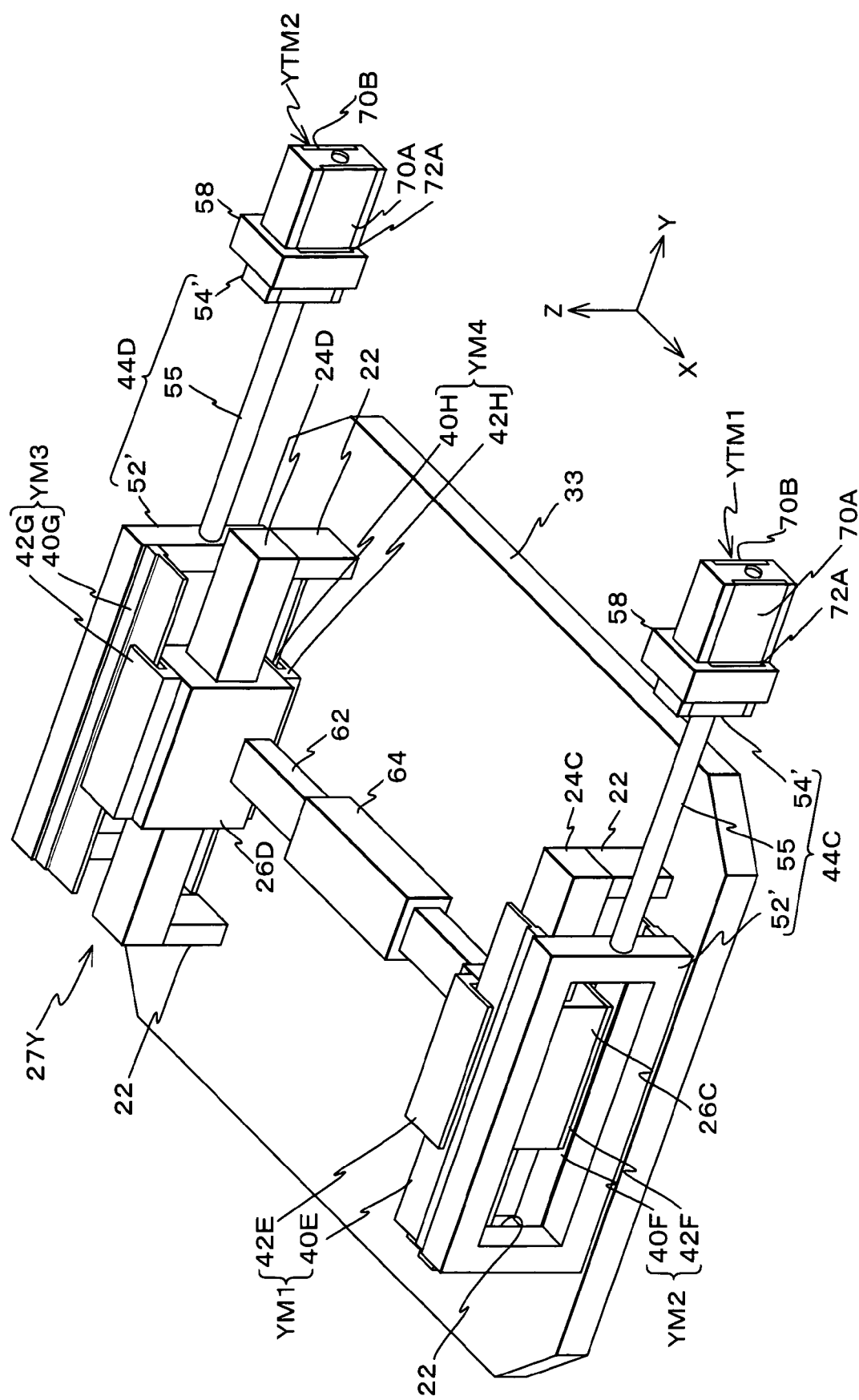
FIG. 5 is a perspective view particularly showing a Y-direction drive mechanism 27Y in FIG. 2.

As is shown in FIG. 2 and a perspective view in FIG. 5 that shows Y-direction drive mechanism 27Y in particular, Y-direction drive mechanism 27Y basically has the similar configuration to X-direction drive mechanism 27X described above, though the arrangement direction of respective components of X-direction drive mechanism 27X in the X-axis direction is different from that of respective components Y-direction drive mechanism 27Y in the Y-axis direction by 90-degrees. In other words, Y-direction drive mechanism 27Y is equipped with: a pair of Y-axis guides 24C and 24D that are arranged extending in the Y-axis direction in the vicinity of an end portion on one side and the other side of the X-axis direction on the upper surface of stage base 33 respectively, and one end and the other end of which in a longitudinal direction are supported by support member 22 respectively; a pair of Y-axis sliders 26C and 26D that are attached to the circumference of Y-axis guides 24C and 24D respectively; a pair of Y-axis linear motors YM1 and YM2 and a pair of Y-axis linear motors YM3 and YM4 that drive Y-axis sliders 26C and 26D along Y-axis guides 24C and 24D respectively; an X guide 62 that has a pair of Y-axis sliders 26C and 26D fixed to one end and the other end of its longitudinal direction; a pair of Y-axis counterweights 44C and 44D that move in a direction opposite to Y-axis sliders 26C and 26D by respectively receiving a reaction force generated at the time of driving Y-axis sliders 26C and 26D by Y-axis linear motors YM1, YM2, YM3 and YM4; and a pair of Y-axis trim motors YTM1 and YTM2 that adjust the positions of Y-axis counterweights 44C and 44D by driving Y-axis counterweights 44C and 44D in the Y-axis direction respectively.

To X guide 62, an X slider 64 whose YZ cross section has a rectangular frame shape is attached slidably.

Y-axis sliders 26C and 26D have a configuration similar to X-axis sliders 26A and 26B, and are respectively supported in a noncontact manner via a predetermined clearance via a non-contact bearing (not shown) with respect to four inner surfaces, i.e. the left, right, top and bottom inner surfaces of each of Y-axis guides 24C and 24D that are made up of a rod member having a rectangular cross section.

Y-axis counterweight 44C is placed on a +X side of Y-axis guide 24C and Y-axis counterweight 44D is placed on a −X side of Y-axis guide 24D, respectively. Each of Y-axis counterweights 44C and 44D has the following three sections respectively, in the similar manner to the X-axis counterweights described above: a vacuum counterweight section 52'; an atmosphere counterweight section 54' that is placed a predetermined distance apart from vacuum counter weight section 52' on a −Y side; and a rod section 55 that interconnects vacuum counter weight section 52' and atmosphere counter weight section 54' and has its longitudinal direction in the Y-axis direction. Also in this case, vacuum counter weight section 52' is supported by levitation via a predetermined clearance (e.g. a clearance of about several µm) above stage base 33 via a noncontact bearing arranged on the bottom surface, for example, differential evacuation type air bearing. Further, movement of vacuum counterweight section 52' in the X-axis direction is blocked by a stopper (not shown) and only movement in the Y-axis direction is permitted.

Also in this case, each vacuum counterweight section 52' is placed in a vacuum space inside wafer stage chamber 45, and each atmosphere counterweight section 54' is placed in the air atmosphere outside wafer stage chamber 45. Incidentally, a part of rod section 55 is placed in vacuum and a remaining part is placed in the atmosphere.

Each atmosphere counterweight section 54' that respectively constitutes a part of each of Y-axis counterweights 44C and 44D is respectively supported by levitation via a predetermined clearance (e.g. a clearance of about several µm) above the upper surface of base plate BP via a noncontact bearing, for example, an air bearing, arranged on the bottom surface of each atmosphere counterweight section 54'.

As is shown in FIG. 5, Y-axis linear motor YM1 has a mover 42E made up of a magnetic pole unit having a U-like shape in a side view (when viewed from a +Y side or −Y side) that is fixed to the upper surface of one Y-axis slider 26C, and a stator 40E made up of an armature coil having a T-like shape in a side view that engages with mover 42E via a predetermined clearance and is fixed to the surface on a −X side of vacuum counterweight section 52' constituting a part of Y-axis counterweight 44C. Further, Y-axis linear motor YM2 has a mover 42F made up of a magnetic pole unit having a U-like shape in a side view that is fixed to the lower surface of Y-axis slider 26C, and a stator 40F made up of an armature unit having a T-like shape in a side view that engages with mover 42F via a predetermined clearance and is fixed to the surface on a −X side of vacuum counterweight section 52' constituting a part of Y-axis counterweight 44C. That is, Y-axis linear motor YM1 or YM2 is a moving magnet type linear motor by an electromagnetic power drive method that generates Lorentz force (a thrust force) that drives Y-axis slider 26C along Y-axis guide 24C by electromagnetic interaction between mover 42E or 42F and corresponding stator 40E or 40F.

Each of Y-axis linear motors YM3 and YM4 is, as is shown in FIG. 5, a moving magnet type linear motor by an electromagnetic power drive method, which has mover 42G or 42H made up of a magnetic pole unit as a second mover that is fixed to the upper surface or the lower surface of the other Y-axis slider 26D respectively, and stator 40G or 40H made up of an armature unit that engages with mover 42G or 42H via a predetermined clearance and is fixed to the surface on a +X side of vacuum counterweight section 52' constituting a part of Y-axis counterweight 44D.

In this case, when a Y movable section constituted by Y-axis sliders 26C and 26D, X guide 62 and X slider 64 is driven in the Y-axis direction by each of pairs of Y-axis linear motors YM1 and YM2, and YM3 and YM4, are action force of the drive force is generated at each of stators 40E, 40F, 40G and 40H, and due to an action of the reaction force, Y-axis counterweights 44C and 44D move in a direction opposite to the Y movable section (such as Y-axis sliders 26C and 26D) according to the law of conservation of momentum.

In the embodiment, in order to prevent Y-axis counterweights 44C and 44D from deviating from the initial positions farther than necessary, a pair of Y-axis trim motors YTM1 and YTM2 are arranged. By these trim motors, like the case of the X-axis counterweights described above, occurrence of the inconvenience is avoided such as the case where vacuum counterweight section 52' or atmosphere counterweight section 54' of Y-axis counterweights 44C and 44D touches wafer stage chamber 45, and the like.

As is shown in FIG. 5, in the similar manner to the X-axis trim motor XTM1 described above, Y-axis trim motor YTM1 is made up of magnetic pole units 70A and 70B that are respectively arranged on a side surface on one side and the other side of the X-axis direction of atmosphere counterweight section 54' constituting a part of Y-axis counterweight 44C, and armature units 72A and 72B (armature unit 72B is not shown in FIG. 5, refer to FIG. 4) that are placed in a state of enclosing the upper surface and both side surfaces in the X-axis direction of atmosphere counterweight section 54', and respectively arranged on the inner opposing surfaces of double housing bent member 58 whose foot portion is fixed to base plate BP. That is, Y-axis trim motor YTM1 is a motor such as a moving magnet type linear motor or voice coil motor that drives Y-axis counterweight 44C in the Y-axis direction.

The other Y-axis trim motor YTM2 is configured similarly to Y-axis trim motor YTM1 described above (refer to FIG. 5).

As can be seen from FIGS. 2, 3 and 5 when they are viewed together, in the embodiment, on X slider 64 that constitutes a part of Y-direction drive mechanism 27Y, Y slider 46 that constitutes a part of X-direction drive mechanism 27X is overlapped in an orthogonal state, and X-direction drive mechanism 27X and Y-direction drive mechanism 27Y are placed on stage base 33 so that a center position in a longitudinal direction of X slider 64 overlaps with a center position in a longitudinal direction of Y slider 46. Further, in order to satisfy this condition, a positional relation in a height direction of X guide 62 with respect to a pair of Y-axis sliders 26C and 26D and a positional relation in a height direction of Y guide 28 with respect to a pair of X-axis sliders 26A and 26B are set. Further, on Y slider 46, wafer table WTB described earlier is mounted via Z/tilt drive mechanism 27Z (not shown in FIG. 2, refer to FIG. 8).

Further, as is shown in FIG. 2, X slider 64 and Y slider 46 are linked by a pair of fastening members 60 (a fastening member located in the depth of the page surface of FIG. 2 is not shown) that has a substantially L-like shape in a side view and has weak rigidity.

Figure 6:
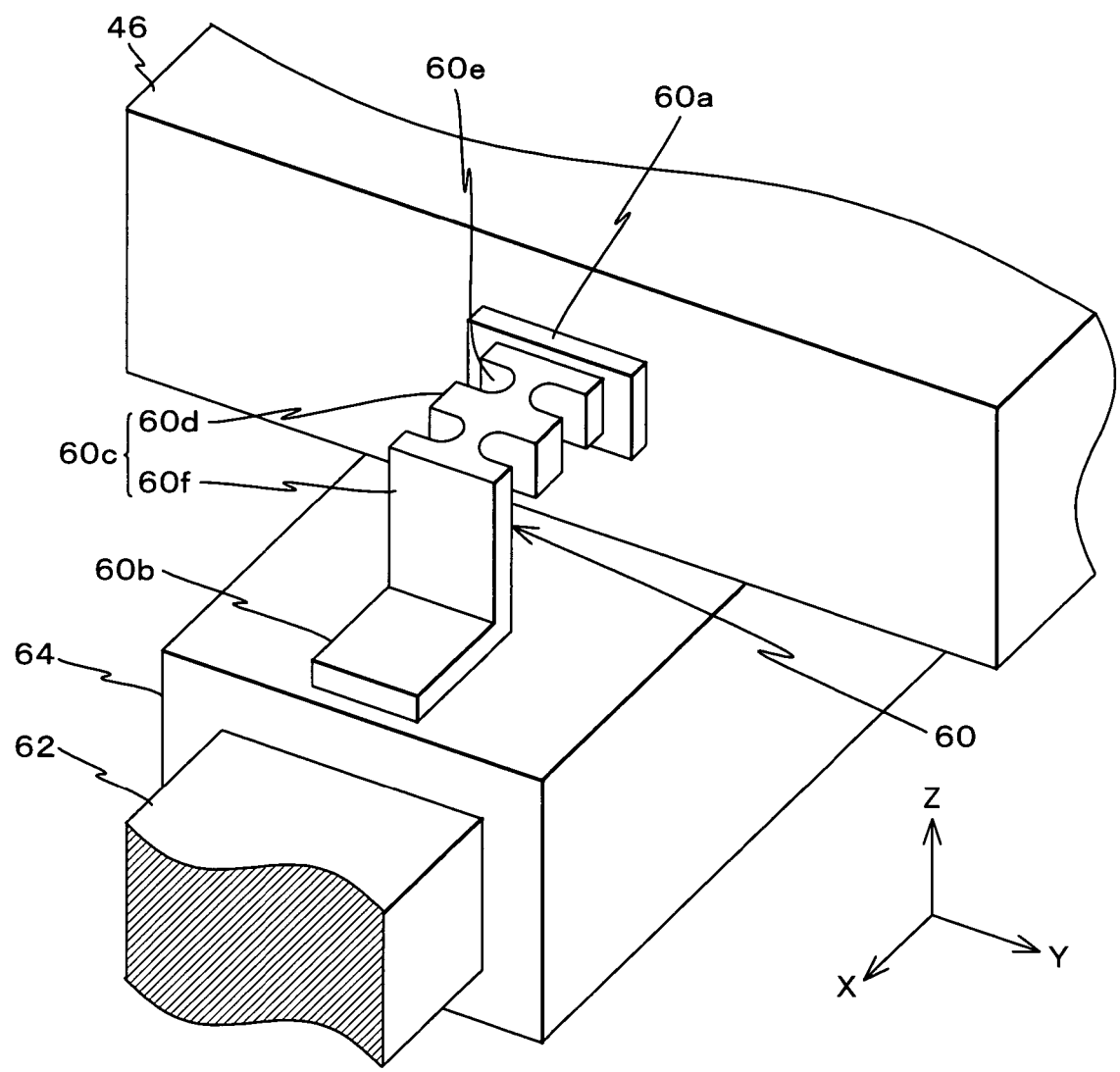
FIG. 6 is a perspective view showing a fastening member that connects a Y slider and an X slider, together with the Y slider and the X slider.

Fastening member 60 is made up of a type of plate spring also serving as a flexure that has a shape as shown in FIG. 6. As is shown in FIG. 6, fastening member 60 has the following three sections in an attached state in FIG. 2: a fixed section 60a that is fixed to the side surface of Y slider 46, a fixed section 60b that is fixed to the upper surface of X slider 64 by a screw or the like (not shown), and a link section 60c having an L-like shape in a side view that links fixed sections 60a and 60b. Link section 60c has a rising section 60f that extends in the +Z direction from fixed section 60b, and a horizontal section 60d that extends from an upper end portion of rising section 60f toward fixed section 60a. On a side surface of horizontal section 60d, a cut out 60e having a U-like shape in a planar view is formed in plural. Therefore, the rigidity of fastening member 60 is comparably low within a plane parallel to an XY plane, compared with that in other directions, and therefore fastening member 60 also serves as a kind of flexure.

As is obvious from the description so far, in the embodiment, XY moving section 22 described earlier is configured of Y slider 46 and X slider 64 that is linked to Y slider 46 via a pair of fastening members 60 (refer to FIG. 2).

Further, in the embodiment, as is shown in FIG. 2, X-axis counterweights 44A and 44B and Y-axis counterweights 44C and 44D are attached in a state where each rod section 55 that constitutes a part of each of X-axis counterweights 44A and 44B and Y-axis counterweights 44C and 44D is inserted into the opening formed at wafer stage chamber 45. In this case, at the periphery portion of the opening, through which each rod section 55 is inserted, on an outer surface side of wafer stage chamber 45, a seal mechanism 66 is severally arranged that keeps an airtight state of the inner space of wafer stage chamber 45 with respect to the outside by blocking the air flow into wafer stage chamber 45 via a gap between the opening and rod section 55, as is representatively shown regarding X-axis counterweight 44A in FIG. 2.

Figure 7:
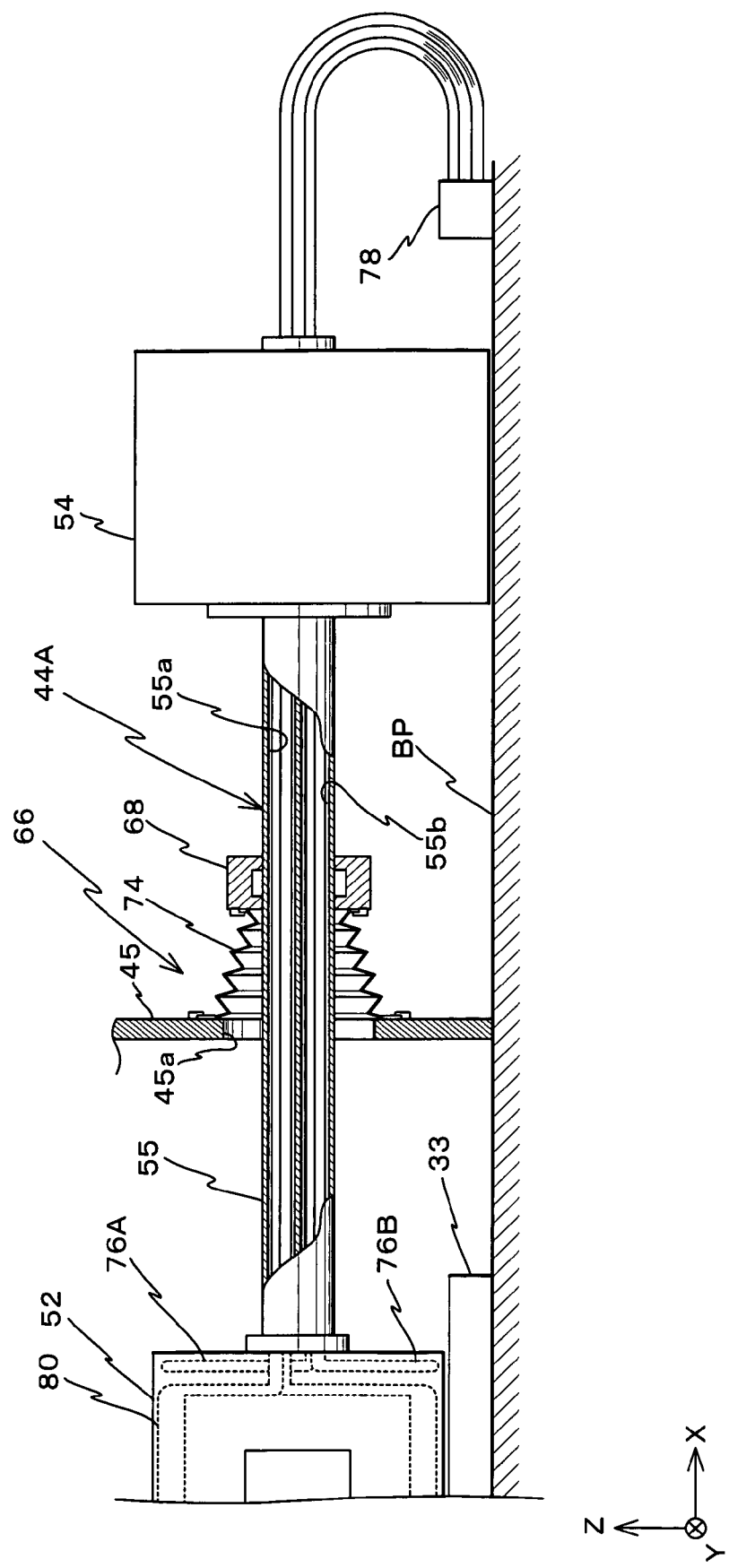
FIG. 7 is a view showing a partially broken view of an X-axis counterweight, together with a seal mechanism.

As is shown in FIG. 7, seal mechanism 66 includes a differential evacuation type air bearing 68 that is attached to the outer circumference portion of rod section 55 that is inserted into a circular-shaped opening 45a formed at wafer stage chamber 45, and a freely extendable/contractible bellows 74 that is arranged between a periphery portion of opening 45a on an outer surface side of wafer stage chamber 45 and air bearing 68, and one end of which is connected to wafer stage chamber 45 without gap and the other end is connected to air bearing 68 without gap. In this case, between air bearing 68 and rod section 55, a predetermined clearance, for example, a clearance of about several μm is formed by static pressure of pressurized air that is blown out from a bearing surface of air bearing 68. Further, in this case, a suction groove (not shown) that is connected to a vacuum pump (not shown) that vacuum suctions the pressurized air that has been blown out is formed at the position on a side of wafer stage chamber 45 (a −X side) of a blow out outlet of the pressurized air, which effectively prevents the blown-out air from flowing into bellows 74.

In other words, in the manner described above, the lowering in a degree of vacuum inside wafer stage chamber 45 caused by the existence of the gap between each rod section 55, which respectively constitutes a part of X-axis counterweights 44A and 44B and Y-axis counterweights 44C and 44D, and corresponding opening 45a is prevented.

Moreover, as is shown in FIG. 7 which representatively shows X-axis counterweight 44A, rod section 55 is made up of a columnar-shaped member, and inside the rod section 55, hollow sections 55a and 55b are formed in a section on an upper side and on a lower side from the center in a vertical direction respectively. In side hollow section 55a on the upper side, two pipes (a supply side pipe and are turn side pipe) for supplying circulation of a cooling medium used to cool the coils that stators 40A and 40B of X-axis linear motors XM1 and XM2 have are inserted. One end (an end section on a side of vacuum counterweight section 52) of each pipe is respectively connected to an end section on one side and the other side of a cooling medium circulation route 80 that is formed inside vacuum counterweight section 52. Further, inside hollow section 55b on the lower side, two lines for supplying power source electric current to the coils described above are inserted. One end of one line is connected to a power supply line 76A inside vacuum counterweight section 52 (power supply line 76A is connected to the coil of stator 40A of X-axis linear motor XM1), and one end of the other line is connected to a power supply line 76B inside vacuum counterweight section 52 (power supply line 76B is connected to the coil of stator 40B of X-axis linear motor XM2). The other ends of the pipes and lines are guided via a through-hole inside atmosphere counterweight section 54 to the outside and are bundled, and respective guided ends are severally connected to a connector section 78 that is fixed on base plate BP. Supply of the power source electric current and supply/drainage of the cooling medium are performed via connector section 78.

In other words, the inner space of X-axis counterweight 44A including hollow sections 55a and 55b is used as a power usage supply section that supplies power usage to X-axis linear motors XM1 and XM2 described above. To be more specific, hollow section 55a and the inner space of X-axis counterweight 44A communicating with hollow section 55a serve as a fluid supply section that supplies a cooling medium (fluid) to the coil, and a hollow section 55b and the inner space of X-axis counterweight 44A communicating with the hollow section 55b serve as an electric current supply section that supplies electric current to the coil.

The similar configuration is also employed in the remaining X-axis counterweight 44B, and the inner space is used as a power usage supply section that supplies power usage to a pair of X-axis linear motors XM3 and XM4.

The similar configuration is also employed in Y-axis counterweights 44C and 44D, and each inner space is used as a power usage supply section that supplies power usage to Y-axis linear motors YM1, YM2, YM3 and YM4.

As is described above, in the embodiment, in a state where the lines for supplying power source electric current to the coil equipped in each of X-axis linear motors XM1 to XM4 and Y-axis linear motors YM1 to YM4 that drives wafer stage WST (i.e. wafer table WTB, Z/tilt drive mechanism 27Z and XY moving section 22) on which wafer W is mounted in the X-axis direction and the Y-axis direction, and the pipes for supplying circulation of a cooling medium used to cool the coil (the stator) that is heated by Joule heat generated by electric current supply are separated from the outside of the respective counterweights, the electric current and the fluid can be supplied to the coil via the lines and the pipes placed inside each counterweight. Therefore, it becomes unnecessary to take into consideration the adverse effect of out gassing from the lines and the pipes on the vacuum space inside wafer stage chamber 45. As a consequence, normal (not for vacuum) soft lines and pipes can be used as the lines and the pipes.

In the embodiment, the circulation of the cooling medium and the supply of power source during operation of the apparatus are performed by main controller 20.

Figure 8:
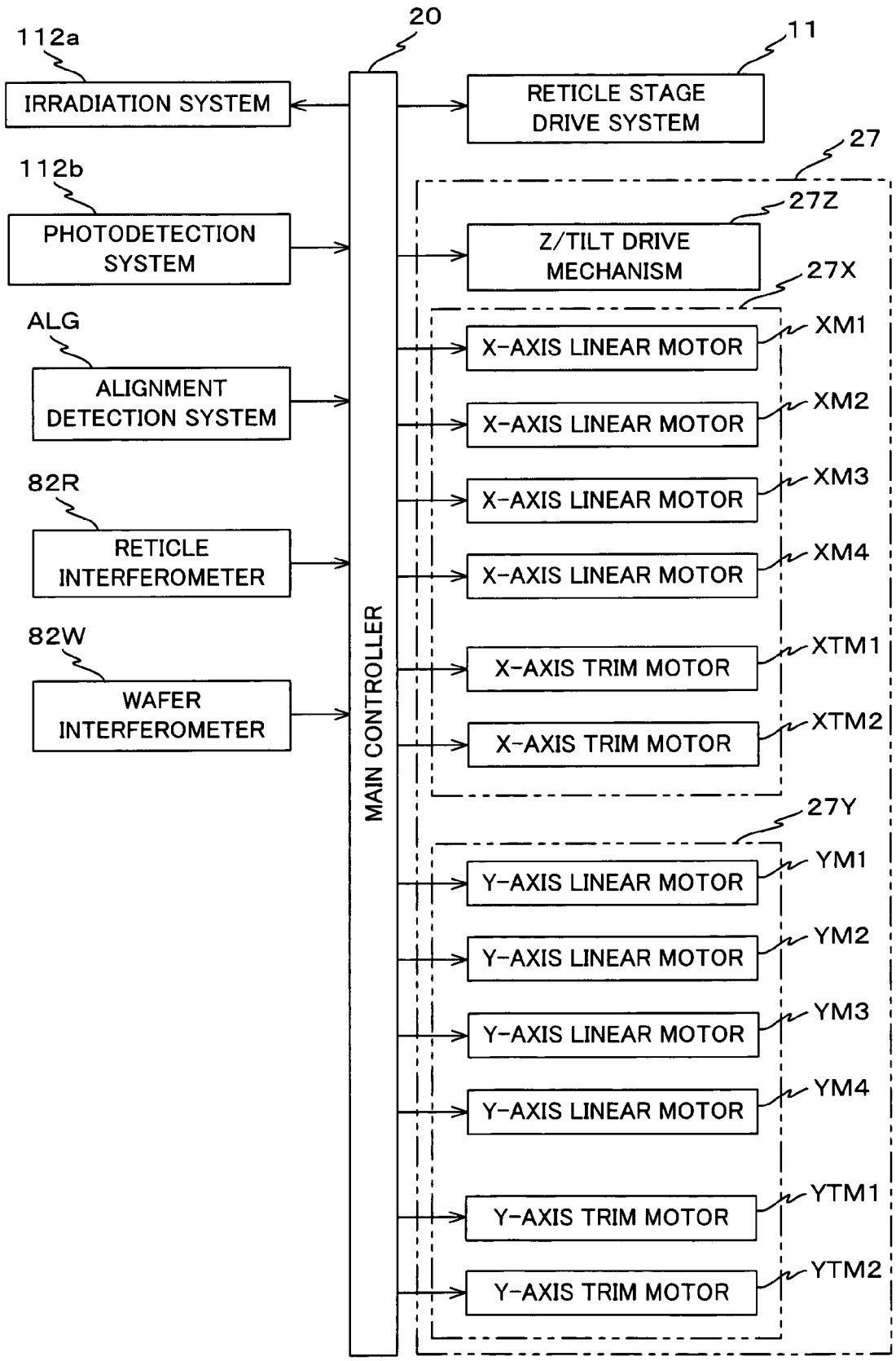
FIG. 8 is a block diagram showing a configuration (partially omitted) of a system related to stage control of the exposure apparatus in FIG. 1.

FIG. 8 shows a configuration of a system related to stage control of exposure apparatus 10 of the embodiment using a block diagram, though a part of the configuration is omitted. The system in FIG. 8 is configured including a so-called microcomputer (or a workstation) made up of a CPU (Central Processing Unit), ROM (Read Only Memory), RAM (Random Access Memory), and the like, and is mainly constituted by main controller 20 that performs over all control of the entire apparatus.

Next, an exposure operation by exposure apparatus 10 of the embodiment configured as described above will be described.

First, reticle R is transported by a reticle transport system (not shown) and is held by suction on reticle stage RST locate data loading position. Next, main controller 20 controls the positions of wafer stage WST and reticle stage RST and a projected image of a reticle alignment mark (not shown) formed on reticle R projected on a surface of wafer W is detected using aerial image measurement instrument FM, and a projection position of the reticle alignment mark on the surface of wafer W is obtained. That is, reticle alignment is performed.

Next, main controller 20 moves wafer stage WST so that aerial image measurement instrument FM is located to directly below alignment detection system ALG, and based on a detection signal of alignment detection system ALG and a measurement value of wafer interferometer 82W at this point of time, a relative distance between an image-forming position of a pattern image of reticle R on a surface of wafer W and alignment detection system ALG, that is, a base line is indirectly obtained.

When such base line measurement ends, main controller 20 performs wafer alignment (such as the EGA) and position information(e.g. position coordinates on a stage coordinate system that is set by measurement axes of the wafer interferometer) of all the shot areas on wafer W is obtained. The details of the EGA are disclosed in, for example, Kokai (Japanese Patent Unexamined Application Publication) No. 61-044429 and the corresponding U.S. Pat. No. 4,780,617 and the like. As long as the national laws in designated states (or elected states), to which this international application is applied, permit, the disclosures of the above publication and the U.S. Patent are fully incorporated herein by reference.

Then, after that, under the control of main controller 20, by using a measurements result of the base line described above and the wafer alignment result, exposure by a step-and-scan method is performed similarly to a normal scanning stepper (a scanner), in which an operation (stepping operation between shot areas) for moving wafer stage WST to a scanning starting position (an acceleration starting position) for exposure of each shot area on wafer W and an operation for transferring a reticle pattern to the shot area in a scanning exposure method are alternately repeated.

Thus, in exposure apparatus 10, processing of an exposure process is executed in the procedures similar to a normal scanner, and at the time of acceleration/deceleration before and after synchronous movement of reticle stage RST and wafer stage WST in the scanning direction (the X-axis direction) for exposure of a shot area, X-axis counterweights 44A and 44B move in a direction opposite to wafer stage WST according to the law of conservation of momentum due to an action of a reaction force of the drive force of wafer stage WST generated at stators 40A to 40D of X-axis linear motors XM1 to XM4, and thereby the reaction force described above is canceled almost completely.

Further, when wafer stage WST is driven in the Y-axis direction with acceleration/deceleration on the stepping between shot areas or the like, Y-axis counterweights 44C and 44D move in a direction opposite to wafer stage WST according to the law of conservation of momentum due to an action of a reaction force of the drive force of wafer stage WST generated at stators 40E to 40H of Y-axis linear motors YM1 to YM4, which cancels the reaction force described above almost completely.

In this case, when wafer stage WST is driven with acceleration/deceleration in an arbitrary direction intersecting with the X-axis direction and the Y-axis direction, movement of X-axis counterweights 44A and 44B according to the law of conservation of momentum and movement of Y-axis counterweights 44C and 44D according to the law of conservation of momentum are performed at the same time, and a reaction force of the drive force of wafer stage WST is canceled almost completely regardless of a drive direction of wafer stage WST.

As is described above, with exposure apparatus 10 of the embodiment, at the time of scanning exposure or stepping between shot areas described above, main controller 20 controls each of X-axis linear motors XM1 to XM4, Y-axis linear motors YM1 to YM4 and the like, and wafer stage WST is driven within the XY plane. In such a case, a reaction force of the drive force is generated at the respective stators of X-axis linear motors XM1 to XM4 and Y-axis linear motors YM1 to YM4, and X-axis counterweights 44A and 44B and Y-axis counterweights 44C and 44D where the respective stators are arranged move in a direction on an opposite side to the movement direction of wafer stage WST due to an action of the reaction force. In this case, a movement distance of the X-axis counterweights and the Y-axis counterweights is a distance that follows the law of conservation of momentum. Accordingly, the reaction force generated by the drive of the wafer stage can be canceled almost completely by the movement of the respective counterweights.

Further, in the embodiment, as is obvious also from FIGS. 2 and 3, regardless of the position of wafer stage WST, a reaction force of the drive force in the X-axis direction of wafer stage WST can be taken out from a center axis of the drive axis of X-axis linear motors XM1 and XM2 and a center axis of the drive axis of X-axis linear motors XM3 and XM4, that is, from a movement axis of X-axis counterweights 44A and 44B. Also, as is obvious also from FIGS. 2 and 5, regardless of the position of wafer stage WST, a reaction force of the drive force in the Y-axis direction of wafer stage WST can be taken out from a center axis of the drive axis of Y-axis linear motors YM1 and YM2 and a center axis of the drive axis of Y-axis linear motors YM3 and YM4, that is, from a movement axis of Y-axis counterweights 44C and 44D. Accordingly, the structure with which reaction processing is performed very easily is employed.

Further, in exposure apparatus 10 of the embodiment, as is described earlier, as the lines and pipes for supplying power usage to X-axis linear motors XM1 to XM4 and Y-axis linear motors YM1 to YM4, soft lines and pipes can be used, and as a consequence, when the lines or pipes are dragged at the time of driving wafer stage WST, there is little possibility that the drive of wafer stage WST is hindered by the tension or floor vibration reaches the wafer drive system or wafer stage WST via the lines or pipes.

Accordingly, in the embodiment, when driving wafer stage WST, occurrence of the vibration that may adversely affect exposure is effectively suppressed, and also position controllability of wafer stage WST is improved.

Further, in exposure apparatus 10 of the embodiment, X-axis counterweight 44A has vacuum counterweight section 52 where the stators of X-axis linear motors XM1 and XM2 are arranged, and atmosphere counterweight section 54 that is separated from vacuum counterweight section 52 in the X-axis direction and is connected to vacuum counterweight section 52 via rod section 55, and X-axis counterweight 44B has vacuum counterweight section 52 where the stators of X-axis linear motors XM3 and XM4 are arranged, and atmosphere counterweight section 54 that is separated from vacuum counterweight section 52 in the X-axis direction and is connected to vacuum counterweight section 52 via rod section 55. Further, Y-axis counterweight 44C has vacuum counterweight section 52' where the stators of Y-axis linear motors YM1 and YM2 are arranged, and atmosphere counterweight section 54' that is separated from vacuum counterweight section 52' in the Y-axis direction and is connected to vacuum counterweight section 52' via rod section 55, and Y-axis counterweight 44D has vacuum counterweight section 52' where the stators of Y-axis linear motors YM3 and YM4 are arranged, and atmosphere counterweight section 54' that is separated from vacuum counterweight section 52' in the Y-axis direction and is connected to vacuum counterweight section 52' via rod section 55. Therefore, as of the foregoing four counterweights 44A to 44D can be located outside wafer stage chamber 45, the inner volume of wafer stage chamber 45 can be set smaller, compared to the case when the entire counterweights 44A to 44D are housed inside wafer stage chamber 45 (inside the stage housing space) where wafer stage WST is housed. In the embodiment, the inside of wafer stage chamber 45 is in a high vacuum state, and therefore by decreasing the inner volume, the cost can be lowered by decrease in the size of a vacuum pump and other vacuum components and the cost can be reduced by reduction in the running cost such as power consumption.

Further, in exposure apparatus 10 of the embodiment, since wafer W is mounted on wafer table WTB of wafer stage WST, and wafer W is exposed by EUV light EL (an energy beam) via reticle R and the projection optical system, exposure can be performed in a state where the effect of vibration caused by a reaction force at the time of driving wafer stage WST is eliminated and exposure accuracy can be improved. Thus, a pattern of reticle R is transferred on to wafer W with good accuracy. In this case, because exposure is performed using EUV light EL, a fine pattern can be transferred on to a wafer with good accuracy by achieving exposure with high resolution.

Figure 9:
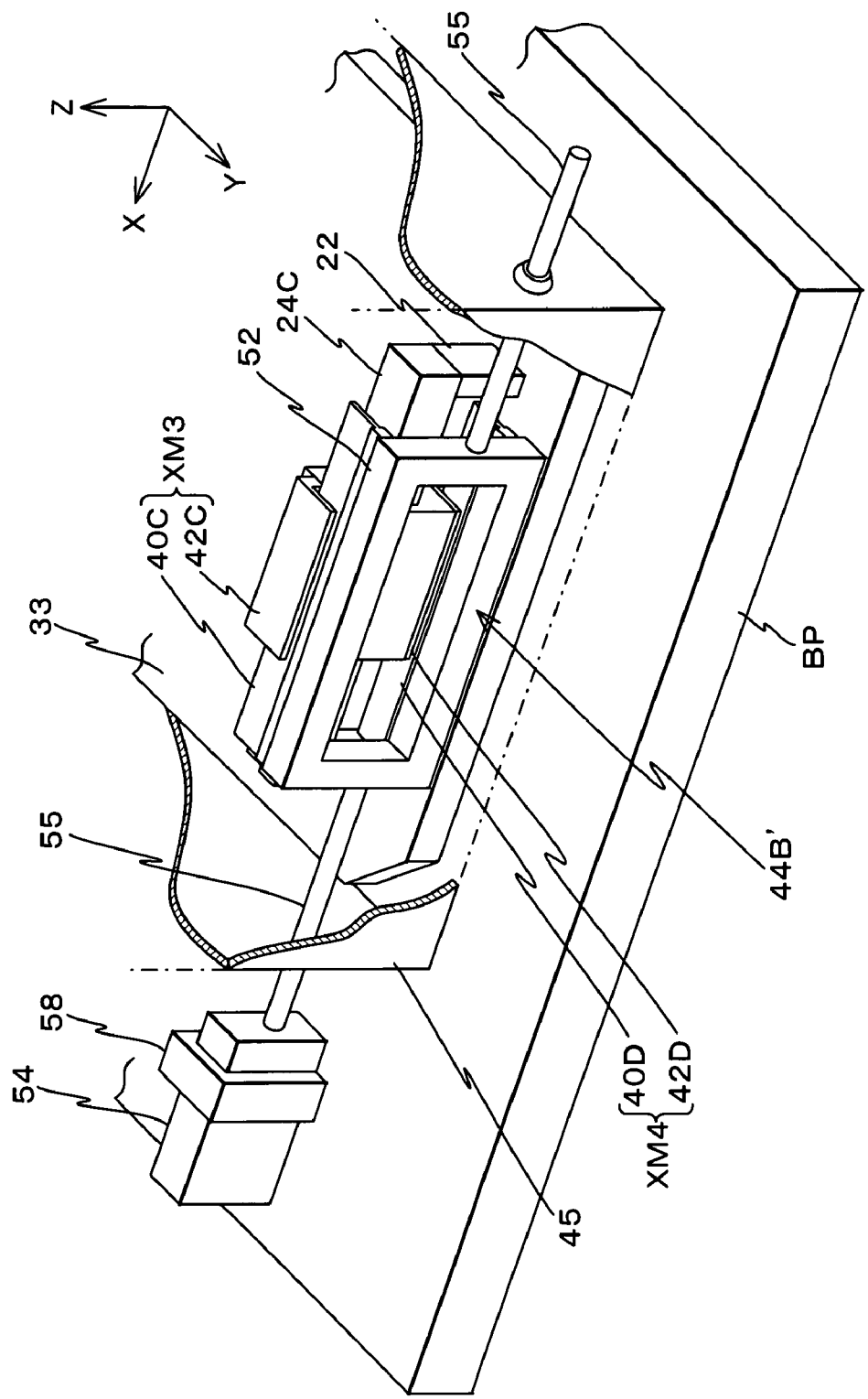
FIG. 9 is a view showing a modified example of a counterweight.

Incidentally, in the embodiment above, the case has been described where the rod sections are arranged on only one side of the vacuum counterweight section so fall X-axis counterweights 44A and 44B and Y-axis counterweights 44C and 44D and the atmosphere counterweight sections are connected via the rod sections. However, the present invention is not limits to this case, and for example, in at least one of X-axis counterweights 44A and 44B and Y-axis counterweights 44C and 44D, the rod section may be arranged on one side and the other side of the vacuum counterweight section respectively. In this case, for example, a counterweight such as an X-axis counterweight 44B' shown in FIG. 9 is used. When using such a counterweight, a force towards –X direction by an accumulated value of all the atmospheric pressure, which acts on a protruding portion of X-axis counterweight 44B' (atmosphere counterweight section 54 and a part of rod section 55) that protrudes to the outside on a +X side of wafer stage chamber 45 (the difference between a force toward –X direction due to the atmospheric pressure that acts on a +X side end surface of atmosphere counterweight section 54 and a force toward +X direction due to the atmospheric pressure that acts on a –X side end surface of atmosphere counterweight section 54), balances with a force toward +X direction by an accumulated value of the atmospheric pressure that acts on a protruding portion of rod section 55 on –X side outside wafer stage chamber 45 (a force toward +X direction due to the atmospheric pressure that acts on a –X side end surface of rod section 55). Therefore, it becomes unnecessary to make the X-axis trim motor constantly generate a thrust force in order to cancel out a force that constantly acts on the counterweight due to the atmospheric pressure.

Incidentally, in FIG. 9, an atmosphere counterweight section may further be arranged at a tip of rod section 55 on a –X side. In other words, the X-axis counterweight and the Y-axis counterweight may have a plurality of atmosphere counterweight sections. Or, the X-axis counterweight and the Y-axis counterweight may have a vacuum counterweight section divided into plural. In either case, by the counterweight having a plurality of sections that are separated from each other, a degree of freedom in design and a degree of freedom in arrangement of the counterweight improve irrespective of whether there is a chamber or not.

Further, in the embodiment above, the case has been described where wafer stage WST is placed in vacuum inside the wafer stage chamber. However, the present invention is not limited to this case, and as is obvious from the description of the embodiment above, the stage unit of the present invention can also be suitably applied to the case where the wafer stage is placed in a space of inert gas atmosphere such as nitrogen, or helium, argon, neon or other halogen inside the wafer stage chamber. Besides, the stage unit of the present invention can also be suitably applied to the case where both the inside and the outside of the wafer stage chamber in which the wafer stage is placed have the air atmosphere, however, a degree of cleanliness inside the wafer stage chamber is different from that outside the wafer stage chamber.

Further, in the embodiment above, the case has been described where the lines for supplying power source electric current and the pipes for supplying a cooling medium to the coils are arranged and placed in the inner space of the counterweight entirely along a longitudinal direction of the counterweight without being open to the outside air, that is, the case where power usage supply sections (an electric current supply section and a fluid supply section) are formed from one end surface to the other end surface of the counterweight. However, the present invention is not limited to this case, and the power usage supply sections may be formed inside a part of the counterweight. For example, in the embodiment above, an opening for leading out the pipes and the lines to the outside of the counterweight may be formed at a portion of the counterweight that is on a further outer side than air bearing 68 shown in FIG. 7, and in this case, a hollow section is not needed on a further outer side than the opening.

Further, in the embodiment above, the case has been described where the stage unit of the present invention is applied as a wafer stage. However, the present invention is not limited to this case, and the stage unit of the present invention can also be applied as a reticle stage.

Incidentally, in the embodiment above, the case has been described where an EUV light having a wavelength of 11 nm is used as an exposure light. However, the present invention is not limited to the case, and an EUV light having a wavelength of 13 nm may be used as an exposure light. In this case, in order to ensure a reflectance of about 70% with respect to an EUV light having a wavelength of 13 nm, a multilayer film that is formed by a layer of molybdenum (Mo) and a layer of silicon (Si) that are alternately over laid needs to be used as a reflective film of each mirror.

Further, in the embodiment above, the SOR (Synchrotron Orbital Radiation) is used as an exposure light source. However the present invention is not limited to this, and either of a laser-excited plasma light source, a betatron light source, a discharged light source, an X-ray laser or the like may be used.

Incidentally, in the embodiment above, the case has been described where an EUV light is used as an exposure light and a total reflection projection optical system made up of only four mirrors is used. However, this is merely one example, and the present invention is not limited to the case as a matter of course. That is, for example, an exposure apparatus that is equipped with a projection optical system made up of only six mirrors can be used as a matter of course, and a VUV light source having a wavelength of 100 to 160 nm, for example, an $Ar_2$ laser (wavelength: 126 nm) can also be used as a light source and a projection optical system that has four to eight mirrors, or the like can also be used.

Further, in the embodiment above, the case has been described where the present invention is applied to a scanning stepper, as an example. However, the application range of the present invention is not limited to the scanning stepper, and the present invention can suitably be applied to a static exposure apparatus such as a stepper that performs exposure in a state where a mask and a substrate are static. Also, the present invention can suitably be applied to an exposure apparatus by a step-and -stitch method likewise.

Further, an object that is subject to exposure of an exposure apparatus is not limited to a wafer for manufacturing semiconductors as in the embodiment above. For example, the object may be a rectangular-shaped glass plate for manufacturing display units such as liquid crystal display devices, plasma displays, organic EL, or a substrate for manufacturing thin film magnetic heads, imaging devices (such as CCDs), masks or reticles.

Further, illumination light EL may be an $F_2$ laser beam (wavelength: 157 nm), and also may be a light having a wavelength longer than 160 nm, such as an ArF excimer laser beam (wavelength: 193 nm) or a KrF excimer laser beam (wavelength: 248 nm). As the projection optical system, in the case a far-ultraviolet light such as a KrF excimer laser beam or an ArF excimer laser beam is used, a material such as quartz or fluorite to which a far-ultraviolet light is transmissive needs to be used as a glass material, and in the case an $F_2$ laser beam or the like is used, a fluorite or other fluoride crystal needs to be used.

Further, for example, as a vacuum ultraviolet light, an ArF excimer laser beam or an $F_2$ laser beam is used. However, the present invention is not limited to these beams, and a harmonic wave may also be used that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal. Moreover, the stage unit of the present invention can also be applied to an immersion exposure apparatus that has liquid (such as pure water) filled in between projection optical system PL and a wafer whose details are disclosed in, for example, the Pamphlet of International Publication No. WO99/49504.

Besides, the present invention can also be applied to an exposure apparatus that uses an electron mask (a variable shaped mask) that forms a light-transmitting pattern or a reflection pattern, or an emission pattern base d on electronic data of the pattern that is to be exposed, for example, a variable shaped mask using a DMD (Digital Micromirror Device) that is a type of a non-emitting image display device (which is also called as a spatial light modulator) as is disclosed in, for example, the U.S. Pat. No. 6,778,257, or to an exposure apparatus (a lithography system) that forms a device pattern on wafer W by forming interference fringe on wafer W as is disclosed in the Pamphlet of International Publication No. WO2001/035168.

Further, the magnification of the projection optical system in the exposure apparatus is not limited to a reduction system, but may be either of an equal magnifying system or a magnifying system, and the projection optical system may be either of a dioptric projection optical system that is made up of only lenses or a catadioptric projection optical system that partially includes lenses. And, the projection image may be either of an inverted image or an upright image.

Incidentally, the usage of the stage unit of the present invention is not limited to an exposure apparatus, and the stage unit can be widely applied to other substrate processing apparatuses (such as a laser repair apparatus, or a substrate inspection apparatus), or apparatuses for setting the position of a specimen in other precision instruments.

Incidentally, semiconductor devices are manufactured through the following steps: a step where the function/performance design of a device is performed; a step where a reticle base d on the design step is manufactured; a step where a wafer is manufactured using materials such as silicon; a lithography step where a pattern formed on a reticle as a mask is transferred onto a wafer as a photosensitive object by the exposure apparatus described in the embodiment above; a device assembly step (including a dicing process, a bonding process, and a packaging process); inspection step, and the like. In this case, in the lithography step, because the exposure apparatus in the embodiment above is used, high integration devices can be manufactured with good yield.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A stage device comprising:
   a first stage that has a mount section on which an object is mounted;
   a first drive device that has a first mover that is connected to the first stage and a first stator that works with the first mover, and drives the first stage in a first axis direction; and
   a first counterweight that has a first section that is connected to the first stator, a second section that is arranged along the first axis direction separately from the first section and a connection section that connects the first section and the second section, and moves in a direction opposite to the first stage in accordance with movement of the first stage in the first axis direction, wherein
   the first counterweight comprises a power usage supply section that supplies power usage to the first drive device.

2. The stage device according to claim 1, further comprising
   a chamber that houses the first stage, wherein
   the second section is placed outside the chamber.

3. The stage device according to claim 1, further comprising:
   a first position adjustment device that adjusts a position of the first counterweight by driving the first counterweight in the first axis direction.

4. The stage device according to claim 1, further comprising:
   a second stage at least a part of which is connected to the first stage, and that moves integral with the first stage in the first axis direction and a second axis direction orthogonal to the first axis direction;
   a second drive device that has a second mover that is connected to the second stage and a second stator that works with the second mover, and drives the first and second stages in the second axis direction; and
   a second counterweight that has a third section that is connected to the second stator, a fourth section that is arranged along the second axis direction separately from the third section and a connection section that connects the third section and the fourth section, and moves in a direction opposite to the second stage in accordance with movement of the first and second stages in the second axis direction.

5. The stage device according to claim 4, further comprising:
   a chamber that houses the first and second stages, wherein the second section and the fourth section are placed outside the chamber.

6. The stage device according to claim 4, wherein the second counterweight comprises a power usage supply section that supplies power usage to the second drive device.

7. The stage device according to claim 4, further comprising:
a first position adjustment device that adjusts a position of the first counterweight by driving the first counterweight in the first axis direction; and
a second position adjustment device that adjusts a position of the second counterweight by driving the second counterweight in the second axis direction.

8. An exposure apparatus that exposes a substrate with an energy beam in order to form a pattern on the substrate, the apparatus comprising:
the stage device according to claim 1, on the mount section of which the substrate is mounted as the object.

9. A stage device, comprising:
a stage that has a mount section on which an object is mounted;
a drive device that has a coil and a magnet, and drives the stage in one axis direction; and
a counterweight where at least one of an electric current supply section that supplies electric current to the coil and a fluid supply section that supplies a fluid to the coil is formed, and that moves in a direction opposite to the stage in accordance with movement of the stage in the one axis direction.

10. The stage device according to claim 9, wherein at least one of the electric current supply section and the fluid supply section is formed inside the counterweight in a state of being isolated from the outside of the counterweight.

11. The stage device according to claim 9, wherein the counterweight has a first section that is connected to one of the coil and the magnet, a second section that is arranged along the one axis direction separately from the first section and a connection section that connects the first section and the second section.

12. An exposure apparatus that exposes a substrate with an energy beam in order to form a pattern on the substrate, the apparatus comprising:
the stage device according to claim 9, on the mount section of which the substrate is mounted as the object.

13. A stage device comprising:
a movable body that moves while mounting an object;
a drive device that has a coil and a magnet, and drives the movable body in a predetermined direction;
a counterweight in which at least one of an electric current supply section that supplies electric current to the coil and a fluid supply section that supplies a fluid to the coil is formed, and which moves in a direction opposite to the movable body in accordance with movement of the movable body;
a chamber that houses the movable body and the counterweight;
a hollow member that has a hollow section, the hollow section being placed so that one end of the hollow section is inserted into the chamber through an opening formed at the chamber and is connected to the counterweight and the other end of the hollow section opens outside the chamber;
a supply member which is placed in the hollow section, one end of which is connected to at least one of the electric current supply section and the fluid supply section, and which performs at least one of electric current supply to the electric current supply section and fluid supply to the fluid supply section from outside the chamber; and
a seal device that is arranged on a periphery of the opening of the chamber to keep an airtight state within the chamber.

14. The stage device according to claim 13, wherein the hollow member is movable synchronously with the counterweight, and
the seal device has one end portion that is connected to the chamber and an other end portion that supports the hollow member.

15. The stage device according to claim 14, wherein the seal device has a fluid bearing that is arranged at the other end portion and movably supports the hollow member.

16. The stage device according to claim 13, wherein the seal device has a freely extendible and contractible bellows in a movement direction of the hollow member.

17. An exposure apparatus that exposes a substrate with an energy beam in order to form a pattern on the substrate, the apparatus comprising:
the stage device according to claim 13, in which the substrate is mounted on the movable body as the object.

* * * * *